US010497769B2

(12) United States Patent
Ohara

(10) Patent No.: US 10,497,769 B2
(45) Date of Patent: Dec. 3, 2019

(54) DISPLAY DEVICE

(71) Applicant: Japan Display Inc., Tokyo (JP)

(72) Inventor: Hiroki Ohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 106 days.

(21) Appl. No.: 15/848,059

(22) Filed: Dec. 20, 2017

(65) Prior Publication Data

US 2018/0182835 A1 Jun. 28, 2018

(30) Foreign Application Priority Data

Dec. 28, 2016 (JP) .................................. 2016-254884

(51) Int. Cl.
*H01L 27/32* (2006.01)
*H01L 51/52* (2006.01)
*G06F 3/041* (2006.01)

(52) U.S. Cl.
CPC ...... *H01L 27/3276* (2013.01); *H01L 51/5203* (2013.01); *G06F 3/0412* (2013.01)

(58) Field of Classification Search
CPC ............. H01L 27/3248; H01L 27/3262; H01L 27/3276; H01L 51/5203; H01L 27/32; H01L 51/52; G06F 3/0412
See application file for complete search history.

(56) References Cited

U.S. PATENT DOCUMENTS

| | | | |
|---|---|---|---|
| 2011/0176081 A1 | 7/2011 | Sonoda et al. | |
| 2013/0306947 A1* | 11/2013 | Yamazaki | H01L 27/3244 257/40 |
| 2017/0040394 A1* | 2/2017 | Huang | H01L 27/1225 |
| 2017/0170424 A1* | 6/2017 | Wu | H01L 51/56 |
| 2017/0222059 A1* | 8/2017 | Chen | H01L 29/78633 |
| 2017/0236892 A1* | 8/2017 | Park | H01L 27/3279 257/40 |
| 2017/0294500 A1* | 10/2017 | Song | H01L 27/3248 |
| 2017/0330917 A1* | 11/2017 | Kim | G06F 3/0412 |
| 2018/0113364 A1* | 4/2018 | Zou | G02F 1/13338 |

FOREIGN PATENT DOCUMENTS

JP 2011151194 A 8/2011

* cited by examiner

*Primary Examiner* — Vinh T Lam
(74) *Attorney, Agent, or Firm* — Michael Best & Friedrich LLP

(57) ABSTRACT

A display device includes a plurality of pixels arranged in a first direction and a second direction intersecting the first direction, a first wiring extending along a pixel arranged in the first direction among the plurality of pixels, and a second wiring extending along a pixel arranged in the second direction intersecting the first direction among the plurality of pixels, wherein at least of the first wiring and the second wiring includes a first conducting layer arranged contacting an insulating surface, a second conducting layer arranged above the first conducting layer, and a third conducting layer arranged contacting an upper surface and side surface of the second conducting layer and contacting a side surface of the first conducting layer, an end part of the third conducting layer being arranged on the insulating surface.

18 Claims, 23 Drawing Sheets

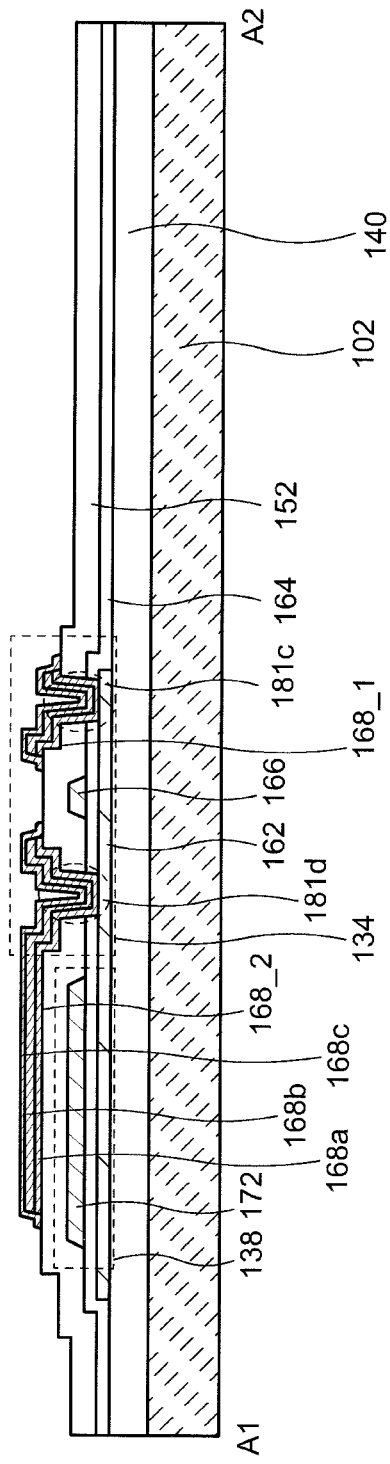

DISPLAY DEVICE

CROSS REFERENCE TO RELATED APPLICATIONS

This application is based upon and claims the benefit of priority from the prior Japanese Patent Application No. 2016-254884, filed on Dec. 28, 2016, the entire contents of which are incorporated herein by reference.

FIELD

In one embodiment of the present invention is related to a display device. For example, in one embodiment of the present invention is related to a structure of wiring in a display device.

BACKGROUND

A liquid crystal display device or an organic electroluminescence display device (described as an EL display device hereinafter) includes a plurality of pixels including a display element such as a liquid crystal element and a light emitting element, it is possible to provide an image by controlling the driving of each pixel.

A display device is manufactured by stacking an insulating film, a semiconductor film and a conductive film, and shaping these thin films into a certain shape. Specifically, each transistor and each circuit in the display device which are formed by a transistor, a wiring pattern forming each circuit, and a wiring pattern routed from a terminal part to which an image signal, a timing signal for controlling the operation of a circuit, and a power supply voltage or the like is applied are manufactured.

In recent years, display devices have been increasing in size and higher definition. Despite the progress in the size of display devices and higher definition, a low resistance material is used for wiring in order to prevent delay of a signal for driving the display device and a voltage drop of a power supply. The low resistance material is aluminum (Al) for example.

On the other hand, aluminum (Al) causes display defects such as a bright spot on the display device due to the treatment in the process of forming the wiring, which lowers the display yield. In order to suppress a decrease in display yield, for example, Japanese Laid Open Patent Publication No. 2011-151194 discloses using a multilayer wiring structure including titanium (Ti) on a lower layer and an upper layer of aluminum (Al).

SUMMARY

One embodiment of the present invention is a display device including a plurality of pixels arranged in a first direction and a second direction intersecting the first direction, a first wiring extending along a pixel arranged in the first direction among the plurality of pixels, and a second wiring extending along a pixel arranged in the second direction intersecting the first direction among the plurality of pixels, wherein at least of the first wiring and the second wiring includes a first conducting layer arranged contacting an insulating surface, a second conducting layer arranged above the first conducting layer, and a third conducting layer arranged contacting an upper surface and side surface of the second conducting layer and contacting a side surface of the first conducting layer, an end part of the third conducting layer being arranged on the insulating surface.

BRIEF DESCRIPTION OF DRAWINGS

FIG. 13B is a cross-sectional schematic diagram for explaining a manufacturing method of a display device related to one embodiment of the present invention;

DESCRIPTION OF EMBODIMENTS

Figure 1:
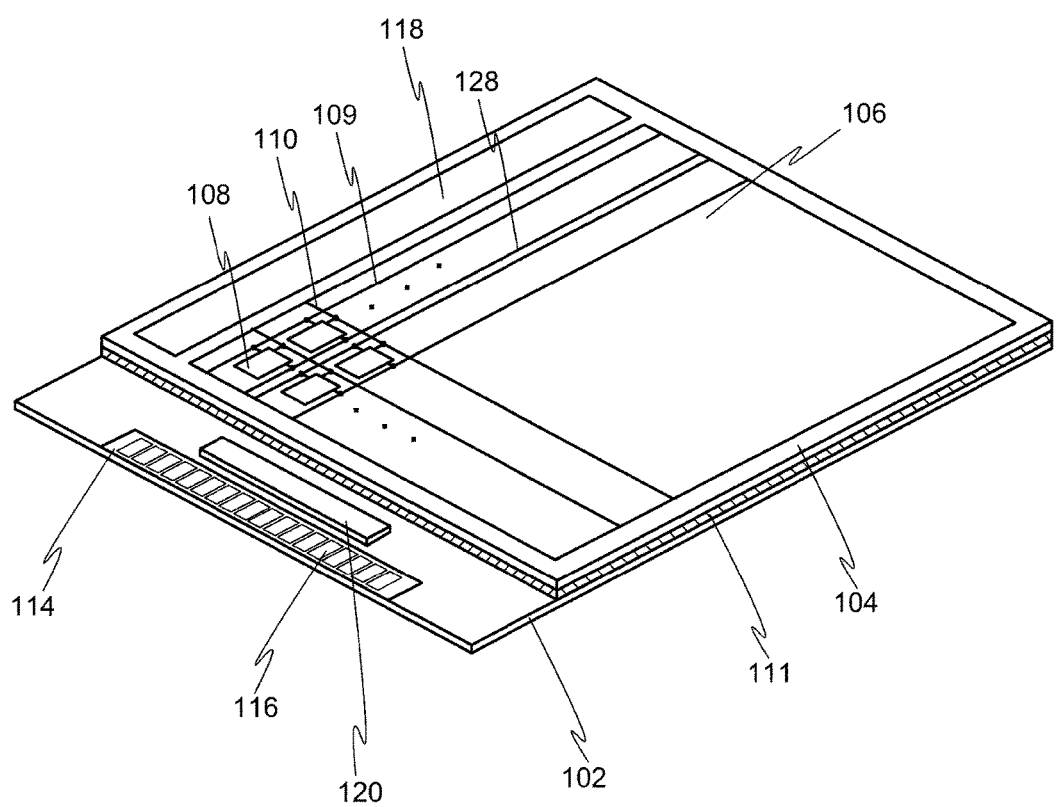
FIG. 1 is a perspective view diagram of a display device related to one embodiment of the present invention.

The embodiments of the present invention are explained below while referring to the diagrams. However, it is possible to perform the present invention using various different forms, and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols (or reference symbols attached with a, b and the like after a number) are attached to similar elements and elements that have been mentioned in previous drawings, and therefore a detailed explanation may be omitted where appropriate. Furthermore, characters denoted by "first", "second" to each element are convenient symbols used for distinguishing each element and unless otherwise stated do not have any extra meaning.

In the present specification, in the case where certain parts or regions are given as "above (or below)" other parts or regions, as long as there is no particular limitation, these include parts which are not only directly above (or directly below) other parts or regions but also in an upper direction (or lower direction). That is, in the case where certain parts or regions are given as "above (or below)" other parts or regions, other structural elements may be included between other parts or regions in an upper direction (or lower direction). Furthermore, in the explanation below, unless otherwise stated, in a cross-sectional view, a side on which a second substrate is arranged with respect to a first substrate is referred to as "upper" or "above" and the reverse is explained as "lower" or "below".

A first substrate described in the present specification has at least one planar main surface, and each layer of an insulating layer, a semiconductor layer and a conductive layer, or each element such as a transistor and a display element are arranged above this main surface. In the explanation below, in the case of where an explanation is given of "upper", "upper layer", "above" or "upper surface" with respect to the first substrate with reference to the one main surface of the first substrate in cross-sectional view, unless otherwise specified, it will be described with reference to the one main surface of the first substrate.

In a multilayer wiring structure in which a material with low resistance is used for wiring, the side surface of the wiring is exposed. When the side surface of the wiring is exposed, it is easy for a developing solution to permeate at the time of forming an insulating film covering the wiring, it is easy for an etching gas to permeate at the time of etching, the shape of the side surface of the wiring (processed shape of the taper) becomes uneven which leads to coverage defects of the insulating film of the wiring upper layer. In particular, in a multilayer wiring structure including a lower layer of aluminum (Al) and an upper layer of titanium (Ti), coverage defects of the upper layer insulating film due to side etching of aluminum (Al) is a serious problem. In addition, the width of the wiring becomes narrow, the wiring becomes high resistance which leads to a delay of a signal passing through the wiring and a voltage drop of a power supply voltage. These cause display defects of the display device and a drop in the display yield.

For example, another problem is the opening of a terminal region after a bonding process of the display device. The bonding process is a process of bonding a substrate formed with a pixel part, a pixel circuit and a driver circuit formed by a transistor, and a terminal region, and a substrate such as an opposing glass or color filter. The terminal region is protected by a sealing film so as not to receive any damage in the bonding process. In order to apply an image signal, a timing signal for controlling the operation of a circuit and a power source voltage and the like from the terminal region, it is necessary to remove this sealing film. The opening of the terminal region is a process for achieving this. An etching gas is used in order to remove the sealing film at the opening of the terminal region. Foreign matter is generated if the etching gas reacts with a material with a low resistance. This foreign matter causes contact defects in the terminal region and corrosion of the wiring.

In view of such problems, an aim of one embodiment of the present invention is to provide a display device having a wiring structure for suppressing deterioration of display defects and a drop in display yield.

In addition, another object of one embodiment of the present invention is to provide a display device having a wiring structure for suppressing contact defects and wiring corrosion.

EMBODIMENT 1

In the present embodiment, the overall structure of a display device 100 according to one embodiment of the present invention, circuit structure, structure of a pixel included in the display device 100, cross-sectional schematic view of a pixel, and structure of a terminal electrode and various wirings are explained while referring to FIG. 1 to FIG. 10.

1. Overall Structure

FIG. 1 shows a perspective view of a display device 100 according to one embodiment of the present invention. The display device 100 includes at least a first substrate 102, a sealing material 111 and a second substrate 104. Furthermore, the sealing material 111 may sometimes not be formed as described herein.

A first surface of the first substrate 102 includes at least a display region 106, various wirings 109, 110 and 128, a scanning signal line driver circuit 118, an image signal line driver circuit (driver IC) 120 and a terminal region 114.

The first substrate 102 acts as a support for the display region 106, the various wirings 109, 110, and 128, the terminal region 114, the scanning signal line driver circuit 118, and the image signal line driver circuit (driver IC) 120. It is possible to use a glass substrate, an acrylic resin substrate, an alumina substrate, a polyimide substrate or the like as a material of the first substrate 102. The first substrate 102 may also be a substrate having flexibility. The substrate having flexibility I formed by a resin material. It is preferred to use a polymer material containing an imide bond as a repeating unit, for example, polyimide for the resin material.

The display region 106 includes a plurality of pixels 108. In the present embodiment, the plurality of pixels 108 is arranged in a matrix. The number of arrangements of the plurality of pixels 110 is arbitrary. For example, m pixels 108 are arranged in a row direction and n pixels 108 in a column direction (m and n are integers). Although not shown in FIG. 1, each of the plurality of pixels 108 is formed from a pixel circuit 130 having at least a drive transistor 134, a selection transistor 132, a light emitting element 136 and a storage capacitor 138 as described herein.

The scanning signal line driving circuit 118 and the image signal line driving circuit (driver IC) 120 are formed on the outer side of the display region 106. The scanning signal line driving circuit 118 and the image signal line driving circuit (driver IC) 120 control driving of a pixel 130. The scanning line driving circuit 126 is not necessarily formed directly above the first substrate 102, and a driving circuit formed above a substrate (a semiconductor substrate or the like) different from the first substrate 102 may be arranged on the first substrate 102.

The terminal region 114 includes a plurality of terminal electrodes 116. The terminal region 114 is arranged at one end of the first substrate 102 and on the outer side of the second substrate 104. A wiring substrate (not shown in the diagram) for connecting the display device 100 with devices that outputs an image signal or a timing signal for controlling the operation of a circuit and the like, or a power source is connected to the plurality of terminal electrodes 116. Contact points with the plurality of terminal electrodes 116 connected to the wiring substrate are exposed to the exterior.

The sealing material 111 is arranged so as to cover the display region 106 on the first surface side of the first substrate 102. The sealing material 111 is formed of a glass substrate and an organic resin substrate the same as the first substrate 102. In addition, the sealant 111 is formed by a stacked body in which an organic resin layer and an inorganic layer are alternately stacked instead of a plate-shaped member such as the first substrate 102.

A substrate similar to the first substrate 102 may be used for the second substrate 104. The second substrate 104 is arranged to oppose the first surface of the first substrate 102. The second substrate 104 is fixed to the first substrate 102 by the sealing material 111 surrounding the display region 106. The display region 106 arranged on the first substrate 102 is sealed by the second substrate 104 and the sealing material 111. However, as long as the second substrate 104 and the first substrate 102 are fixed by a means other than the the sealing material 111, the sealing material 111 is not necessarily required.

Furthermore, although the display device 100 according to the present embodiment includes the second substrate 104 as described above, it is not limited to a plate-shaped member and may be replaced with a film substrate or a sealing substrate coated with a resin or the like.

2. Circuit Structure

Figure 2:
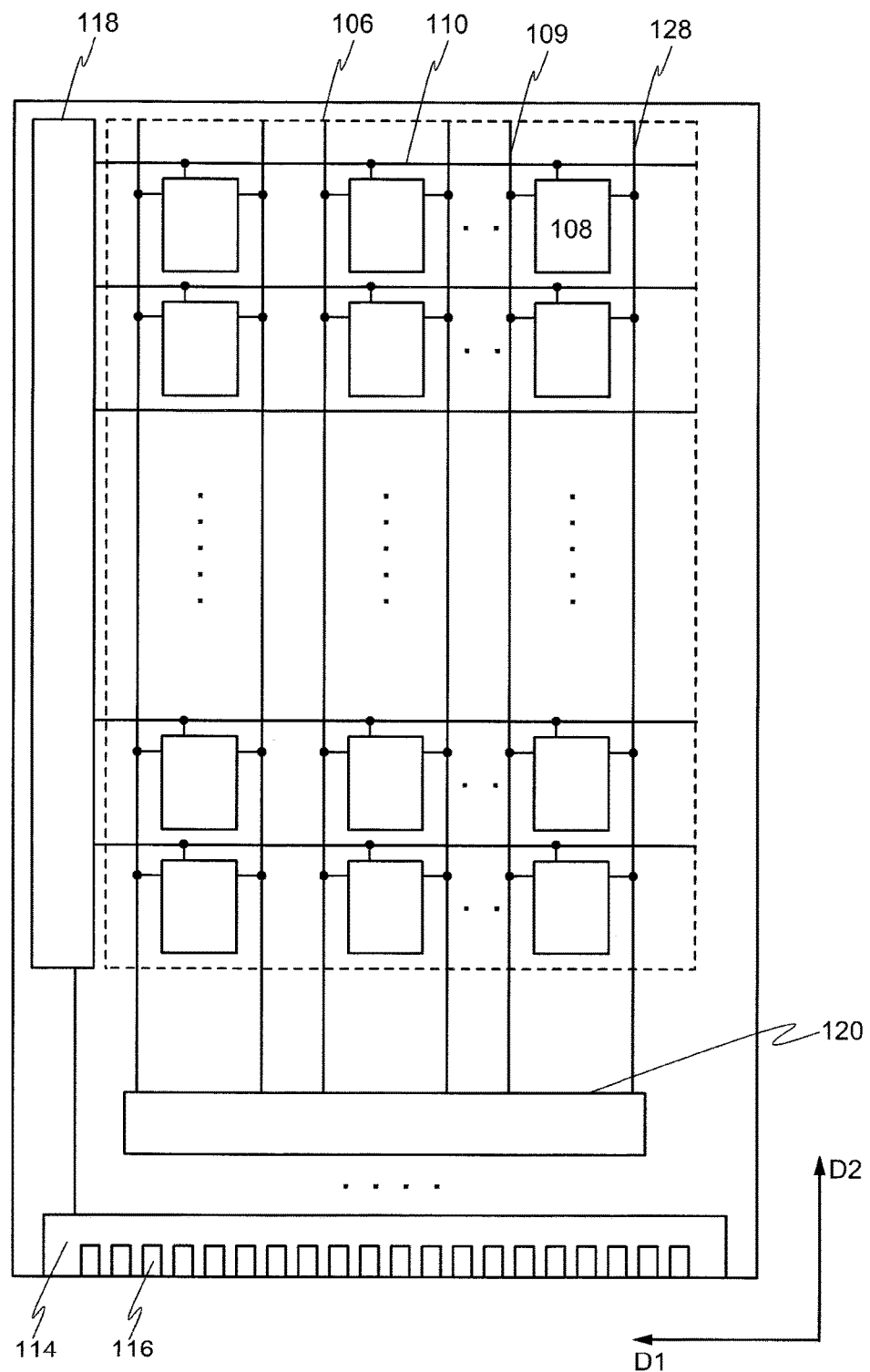
FIG. 2 is a planar view schematic diagram showing the structure of a display device related to one embodiment of the present invention.

FIG. 2 is a planar schematic view of a circuit structure of the display device 100 according to one embodiment of the present invention. The display device 100 includes at least a display region 106, various wirings 109, 110, and 128, a scanning signal line driving circuit 118, an image signal line driver circuit (driver IC) 120 and a terminal region 114. Furthermore, the display region 106 includes a plurality of pixels 108.

The scanning signal line driving circuit 118 and the image signal line driving circuit (driver IC) 120 drive pixel circuits 130 arranged in each of the plurality of pixels 108 and control light emission of the plurality of pixels 108.

The scanning line driving circuit 118 is connected to the plurality of scanning signal lines 110. The plurality of scanning signal lines 110 are arranged for each horizontal direction line (row) of the plurality of pixels 108. The scanning line driving circuit 118 sequentially selects a plurality of scanning signal lines 110 according to a timing signal and a power supply input from a plurality of terminal electrodes 116.

The image signal line drive circuit (driver IC) 120 is connected to a plurality of image signal lines 109. The plurality of image signal lines 109 are arranged for each vertical direction line (column) of the plurality of pixels 108. The image signal line drive circuit (driver IC) 120 is input with an image signal from a plurality of terminal electrodes 116, and writes a voltage via each of the plurality of image signal lines 110 according to an image signal of a selected pixel in accordance with the selection of the scanning signal line 110 by the scanning line drive circuit 118. In addition, the image signal line drive circuit (driver IC) 120 supplies a current supplied from the plurality of terminal electrodes 116 to each of the drive power supply lines 128 which causes the pixels 110 of a selected row to emit light.

Furthermore, a power supply circuit for supplying a current to the drive power supply line 128 may be arranged on the first surface of the first substrate 102. The power supply circuit is connected to a plurality of drive power supply lines 128 arranged for each column and supplies a current for causing the pixels 108 of a selected row to emit light.

The plurality of pixels 108 are arranged in a row direction and a column direction. The number of arrangements of the pixels 108 is arbitrary. For example, m pixels 108 are arranged in a row direction (D1 direction) and n pixels 108 in the column direction (D2 direction) (m and n are integers). In the display region 106, the plurality of scanning signal lines 110 are arranged in the row direction and the plurality of image signal lines 110 are arranged in the column direction.

Furthermore, although coordinate axes are shown outside the display device 100 in FIG. 2, it is assumed that the actual coordinate axes are fixed to the display device 100.

Figure 3:
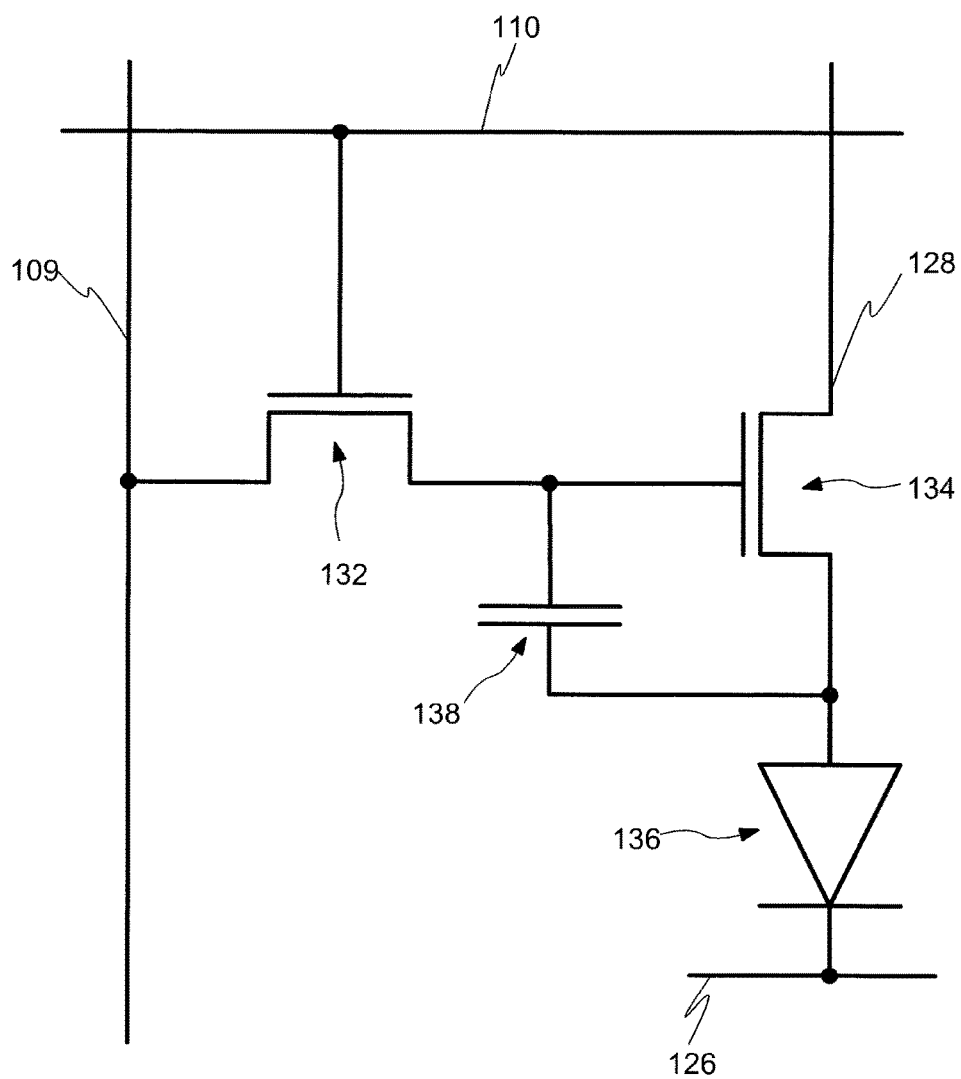
FIG. 3 is a structural circuit diagram of a pixel part in a display device related to one embodiment of the present invention.

FIG. 3 shows a circuit diagram of a pixel circuit 130 of a pixel 108 included in the display device according to one embodiment of the present invention. Furthermore, the circuit structure of the pixel circuit 130 explained below is merely an example and the present invention is not limited to this example.

Each of the plurality of pixel circuits 130 includes at least a drive transistor 134, a selection transistor 132, a light emitting element 136 and a storage capacitor 138.

The drive transistor 134 is a transistor which is connected to the light emitting element 136 and controls light emission luminosity of the light emitting element 136. In the drive transistor 134, a drain current is controlled by a gate/source voltage. The gate of the drive transistor 134 is connected to the drain of the selection transistor 132, the source is connected to the drive power supply line 128, and the drain is connected to the anode of the light emitting element 136.

The selection transistor 132 is a transistor that controls a conduction state between an image signal line 109 and the gate of the drive transistor 134 by an on/off operation. The gate of the selection transistor 132 is connected to a scanning signal line 110, the source is connected to an image signal line 109, and the drain is connected to the gate of the drive transistor 134.

An anode of the light emitting element 136 is connected to the drain of the drive transistor 134 and a cathode is connected to a reference power supply line 126.

The storage capacitor 138 is connected between the gate and drain of the drive transistor 134. The storage capacitor 138 stores a gate/drain voltage of the drive transistor 134.

Here, as is described in FIG. 2, the reference power supply line 126 is arranged in common to a plurality of pixels 108. A constant potential is provided to the reference power supply line from a plurality of terminal electrodes 116.

Furthermore, a power supply circuit for generating a constant voltage may be arranged on the first surface of the first substrate 102. A power supply circuit for generating a constant voltage is connected to a reference power supply line 126 arranged in common to a plurality of pixels 108 and a constant potential is applied to the cathode of the light emitting element 136.

3. Structure and Cross-Section of a Pixel

Figure 4:
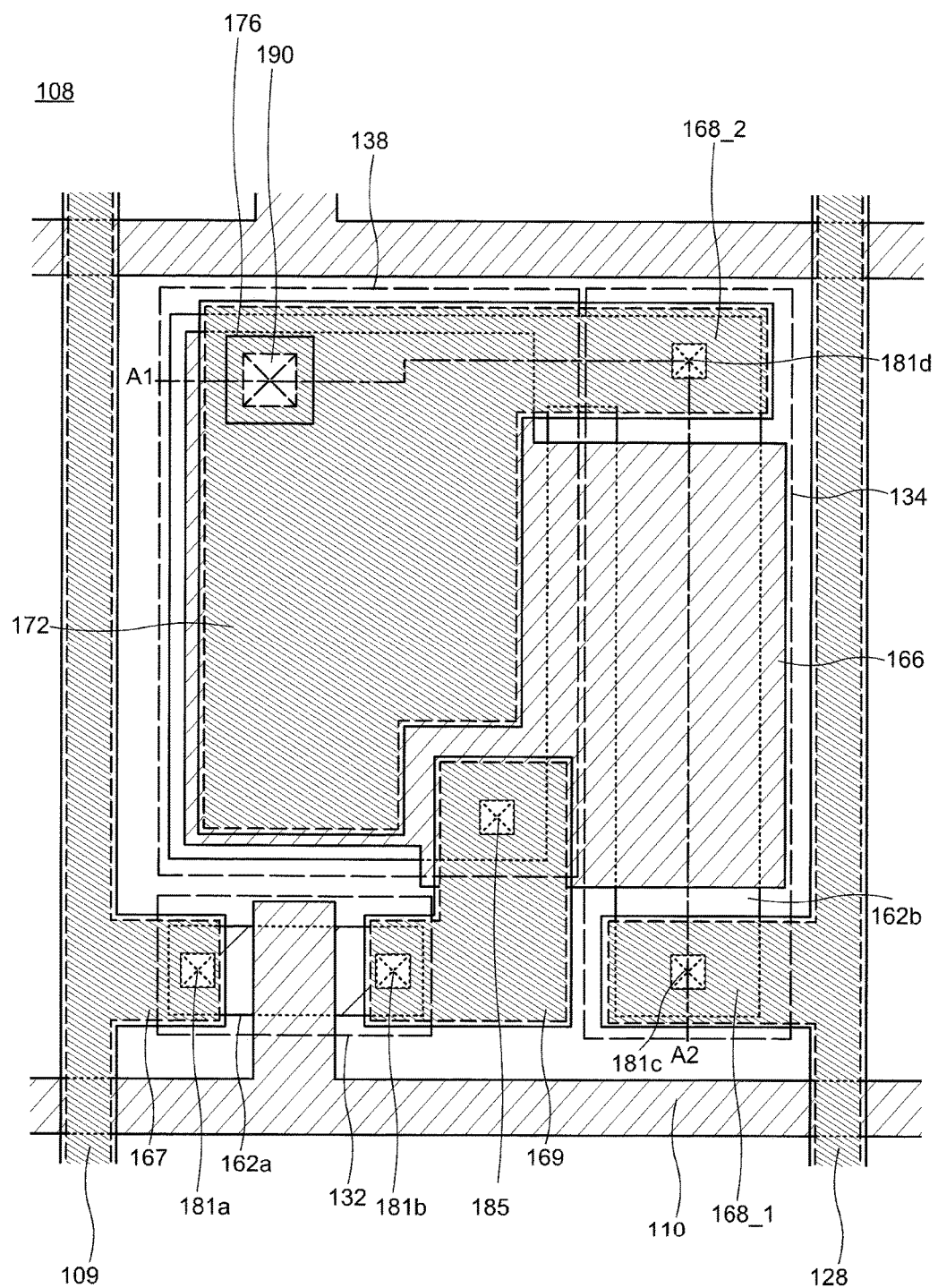
FIG. 4 is a layout diagram of a pixel part in a display device related to one embodiment of the present invention.
Figure 5:
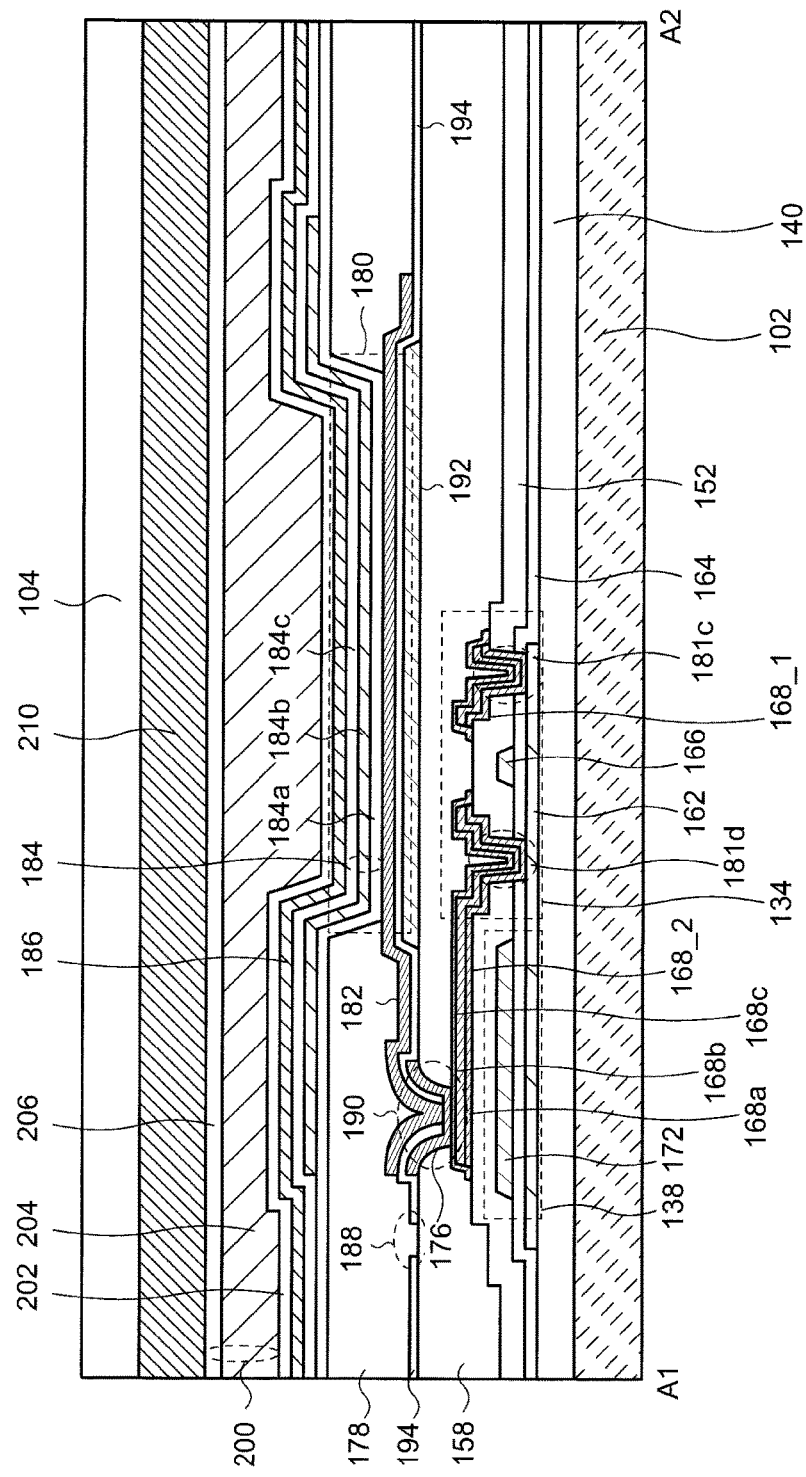
FIG. 5 is a cross-sectional schematic diagram of a pixel part in a display device related to one embodiment of the present invention.

FIG. 4 shows a layout diagram of the pixel circuit shown in FIG. 3. FIG. 5 is a cross-sectional schematic view of the pixel circuit 130 shown in FIG. 4. FIG. 5 shows a cross-section between A1 and A2 in FIG. 4. An insulating film and an interlayer film of the gate insulating film 164 and the interlayer film 152 explained below are omitted from FIG. 4. In addition, processes after the formation of the connection electrode 176 which are explained below are omitted from FIG. 4, and these are shown in FIG. 5. Furthermore, the layout diagram shown in FIG. 4 and the cross-sectional schematic view shown in FIG. 5 are merely examples, and the present invention is not limited to these examples.

FIG. 4 and FIG. 5 show a part of one pixel circuit 130 included in one pixel 108. Here, although an example in which a drive transistor 134, storage capacitor 138 and light emitting element 136 and the like are included in one pixel circuit 130 is shown, the pixel circuit 130 may be arranged with a plurality of transistors and a plurality of capacitors.

The display device 100 includes the drive transistor 134 and the capacitor 138 above the substrate 102 described in the overall structure via an underlying film 140 having an arbitrary structure. As is shown in FIG. 5, for example, the transistor 134 includes a semiconductor film 162, a gate insulating film 164, a gate electrode 166, a source or drain electrode 168_1, and a source or drain electrode 168_2. A region of the semiconductor film 162 which overlaps with the gate electrode 166 is a channel region and this channel region is sandwiched between a pair of source regions or drain regions. The source or drain electrode 168_1 and the source or drain electrode 168_2 are electrically connected to the source region or the drain region via the interlayer film 152 and opening parts 181a, 181b, 181c and 181d arranged in the gate insulating film 164. Furthermore, as is shown in FIG. 4, the source or drain electrode 169 is also electrically connected to the gate electrode 166 via an opening part 185 arranged in the interlayer film 152. The semiconductor film 162 extends under the storage capacitor electrode 172, and a capacitor is formed by the semiconductor film 162, the storage capacitor electrode 172, and the gate insulating film 164 sandwiched therebetween.

There are no restrictions to the structure of the drive transistor 134, and not only a so-called top gate type transistor as shown in FIG. 5 but also a bottom gate type transistor, a multi-gate type transistor having a plurality of gate electrodes 166, or a dual gate transistor having a gate electrode 166 above and below the semiconductor film 162 may be used. There is also no restriction on the vertical relationship between the semiconductor film 162 and the source or drain electrode 168.

The capacitor 138 is formed from a part of the source or drain electrode 168_2, the electrode 172 of a storage capacitor and the interlayer film 152. The capacitor 138 has the role of storing the potential provided to the gate electrode 166. The electrode 172 of a storage capacitor is electrically connected to the gate electrode 166.

A planarizing film 158 is arranged above the transistor 160 and the capacitor 138 to absorb irregularities resulting from these and to provide a flat surface. An opening 190 which reaches the source or drain electrode 168_2 is arranged in the planarization film 158, and a connection electrode 176 is arranged to cover the opening 190. Furthermore, the connection electrode 176 is also a part of an arbitrary structure.

The wiring used in the display device according to one embodiment of the present invention is used as a source electrode or a drain electrode. In addition, the wiring may also be used for a gate electrode and an electrode of a storage capacitor.

A wiring used in a display device according to one embodiment of the present invention is formed form a first conducting layer, a second conducting layer and a third conducting layer.

A wiring used in a display device according to one embodiment of the present invention includes a multilayer wiring structure including a first conducting layer in contact with insulating film, a second conducting layer arranged above the first conducting layer, and a third conducting layer which is in contact with an upper surface and a side surface of the second conducting layer and a side surface of the first conducting layer and an end part is arranged above the insulating film.

A formation method of the wiring used in the display device according to one embodiment of the present invention includes forming a first conducting layer, subsequently forming a second conducting layer, and simultaneously processing the first conducting layer and the second conducting layer. Furthermore, a third conductive layer is formed and processed. In this way, the wiring is formed by processing in two steps. A detailed formation method is described in the manufacturing method.

The third conducting layer is arranged in contact with a side surface of the second conducting layer and a side surface of the first conducting layer and an end part of the third conducting layer is arranged on the insulating film. In this way, a structure in which the third conducting layer is arranged in contact with a side surface of the second conducting layer and on the insulating film is one in which the side surface of the second conducting layer is not permeated by an etching gas, developing solution and stripping solution when subsequently forming a planarization film. In addition, the second conducting layer is not side-etched. Therefore, the taper shape of the first conducting layer and the second conducting layer can be stably formed. In addition, it is possible to stably form coverage where the third conducting layer is in contact with the first conducting layer and the second conducting layer. Furthermore, it is also possible to stable form coverage where the planarization film is in contact with the third conducting layer. Therefore, it is possible to suppress deterioration of display defects and a drop in the display yield, and it is possible to provide a display device that suppresses contact defects and corrosion of wiring.

The source or drain electrode 167, the source or drain electrode 168_1, the source or drain electrode 168_2, and the source or drain electrode 169 have a multilayer wiring structure including the first conducting layer 168a the second conducting layer 168b, and the first conducting layer 168c. The first conducting layer 168a is in contact with the interlayer film 152. The second conducting layer 168b is arranged above the first conducting layer 168a. The third conductive layer 168c is arranged in contact with an upper surface and a side surface of the second conducting layer 168b and is in contact with a side surface of the first conducting layer 168a. An end part of the first conducting layer 168c is arranged on the interlayer film 152.

By arranging the third conducting layer 168c in contact with the side surface of the second conducting layer 168b and the side surface of the first conducting layer 168a, and by the end part of the third conducting layer 168c arranged on the interlayer film 152, the side surface of the second conducting layer 168b is not permeated by the etching gas, the developing solution and the stripping solution when forming the planarization film 158. In addition, the second conducting layer is not side-etched. Therefore, the shape of the side surface of the wiring (taper processed shape) can be stably formed. In addition, coverage of the planarization film 158 is also good. It is possible to provide a display device in which display defects and a drop in display yield are suppressed and having a wiring structure for suppressing contact defects and wiring corrosion.

In addition, the source or drain electrode 167 is electrically connected to the image signal line 109. The source or drain electrode 168_1 is electrically connected to the drive power supply line 128. Therefore, it is possible to suppress a delay of signals which pass through wiring and a voltage drop of a power supply voltage. Therefore, it is possible to provide a display device which suppresses display defects and a drop in the display yield and has a wiring structure which suppresses contact defects and wiring corrosion.

Furthermore, an additional capacitor electrode 192 may be arranged above the planarization film 158. A capacitor insulating film 194 is formed to cover the additional capacitor electrode 192, a part of the connection electrode 176 and the planarization film 158. The additional capacitor electrode 192 forms an additional capacitor together with the capacitor insulating film 194 and the first electrode 182 of the light emitting element 180 formed above, and contributes to reducing variation in light emission of the light emitting element 180.

An opening 188 which exposes the planarization film 158 may be arranged in a part of the capacitor insulating film 194. The opening 188 functions as an opening for moving impurities (water or gases such as oxygen) desorbed from the planarization film 158 and the interlayer film 152 toward a partition wall 178 arranged above the opening 188.

A part of the connection electrode 176 is exposed from the capacitor insulating film 194, and the first electrode 182 is arranged to cover the exposed part. The partition wall 178 is arranged to cover the end part of the first electrode 182, thereby relieving a step caused by the first electrode 182 so that it is possible to prevent cutting the EL layer 184 and the second electrode 186 formed above.

The light emitting element 180 is formed by a first electrode 182, a second electrode 186 and an EL layer 184 arranged therebetween. The EL layer 184 is formed to cover the first electrode 182 and the partition wall 178, and the second electrode 186 is arranged above. Carriers (electrons, holes) are injected into the EL layer 184 from the first electrode 182 and the second electrode 186 and carrier recombination occurs in the EL layer 184. In this way, the excited state of an organic compound included in the EL layer 184 is formed, and the energy released when the excited state relaxes to the ground state is utilized as light emission. Therefore, a region where the EL layer 184 and the first electrode 182 are in contact is a light emitting region.

Although an example in which an EL layer has three layers (184a, 184b, 184c) is shown in FIG. 5, the layer structure of the EL layer is not limited, and four or more layers may be stacked. For example, the light emitting element 180 can be formed by appropriately stacking various functional layers such as a carrier injection layer, a carrier transport layer, a light emitting layer, a carrier blocking layer and an exciton blocking layer.

In FIG. 5, while the EL layers 184a and 184c extend to adjacent pixels 108, the layer 184b (for example, light emitting layer) is selectively arranged only within one pixel 108. In this way, the structure of the EL layer 184 between adjacent pixels 108 may be different. In this way, for example, different light emitting colors can be provided between adjacent pixels 108. Alternatively, EL layers 184 having the same structure may be formed between adjacent pixels 108. In this case, for example, by forming a light emitting element capable of emitting white light by each pixel 108 and arranging color filters having different optical characteristics between adjacent pixels, it is possible to extract various colors from the pixels 108 and full color display becomes possible.

A passivation film (protection film) 200 for protecting a light emitting element 180 may be arranged above the light emitting element 180. Although the structure of the passivation film 200 can be arbitrarily selected, the passivation film 200 can have a three layer structure as is shown in FIG. 5 for example. In this case, the passivation film 200 may have a structure in which, for example, an organic film 204 including an organic compound is sandwiched between two inorganic films (first inorganic film 202 and second inorganic film 206) including an inorganic compound.

A second substrate 104 is arranged above the passivation film 200 via a filler 210. The second substrate 104 protects the passivation film 200 and each element arranged below the passivation film 200.

4. Structure and Cross-Section of Terminal Electrode and Various Wiring

Figure 6:
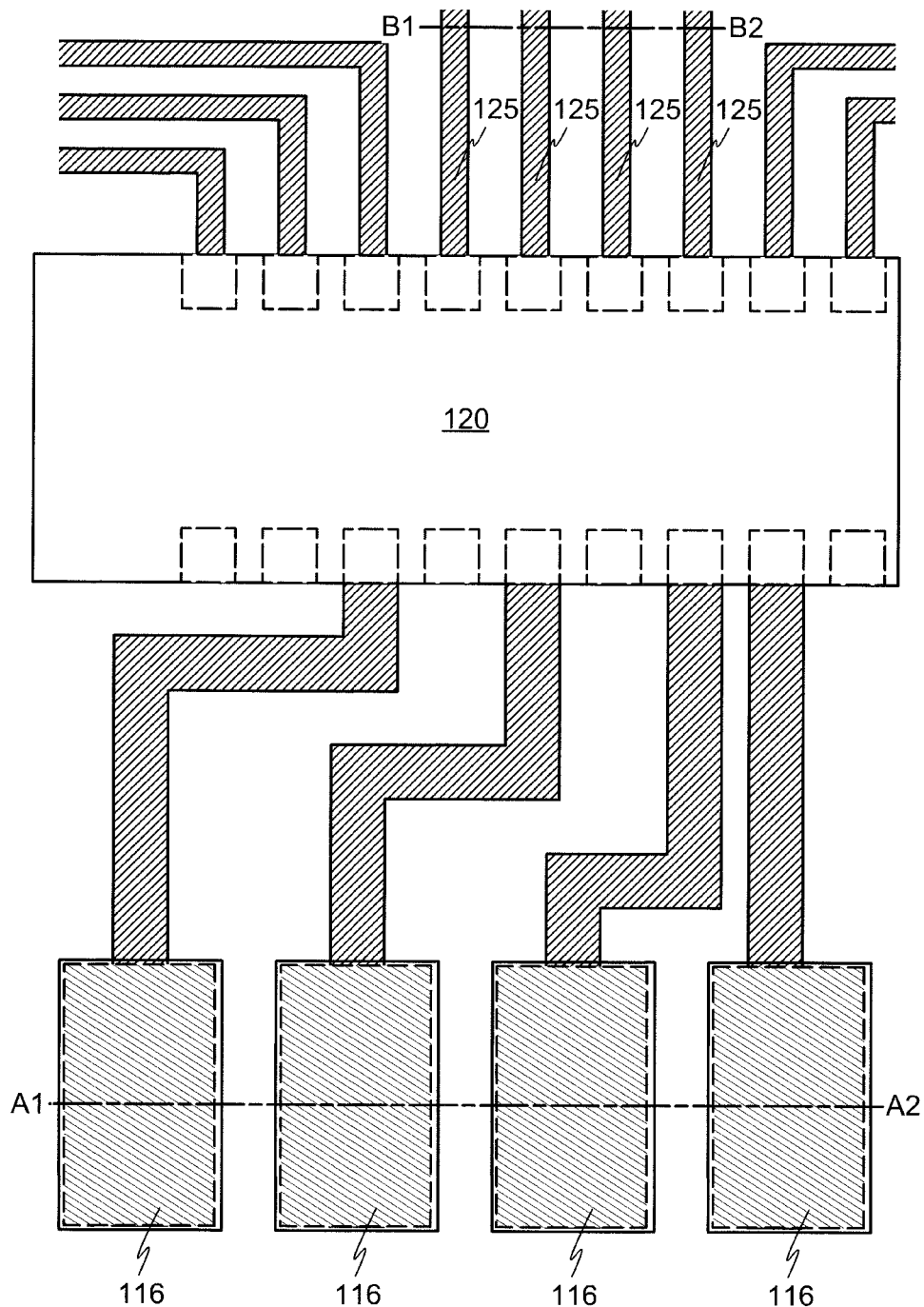
FIG. 6 is a planar view schematic diagram of wiring and a terminal electrode in a display device related to one embodiment of the present invention.
Figure 7:
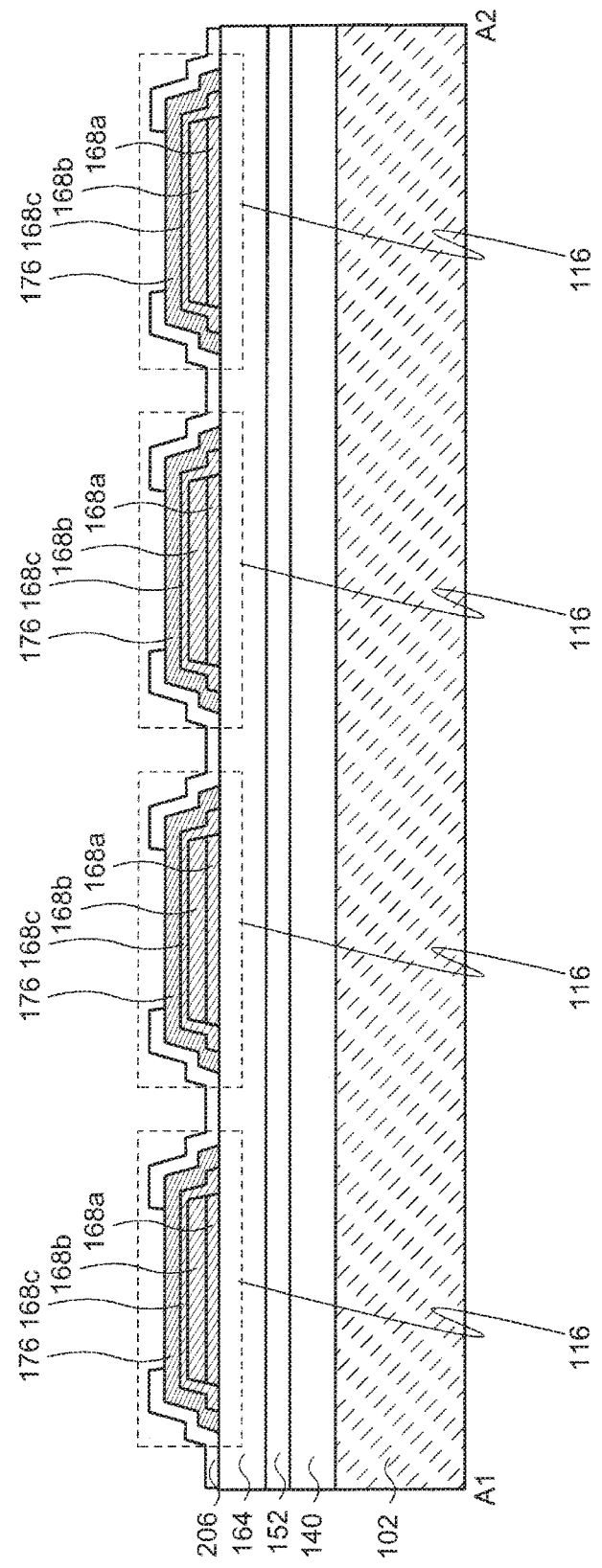
FIG. 7 is a cross-sectional schematic diagram of a terminal electrode in a display device related to one embodiment of the present invention.
Figure 8:
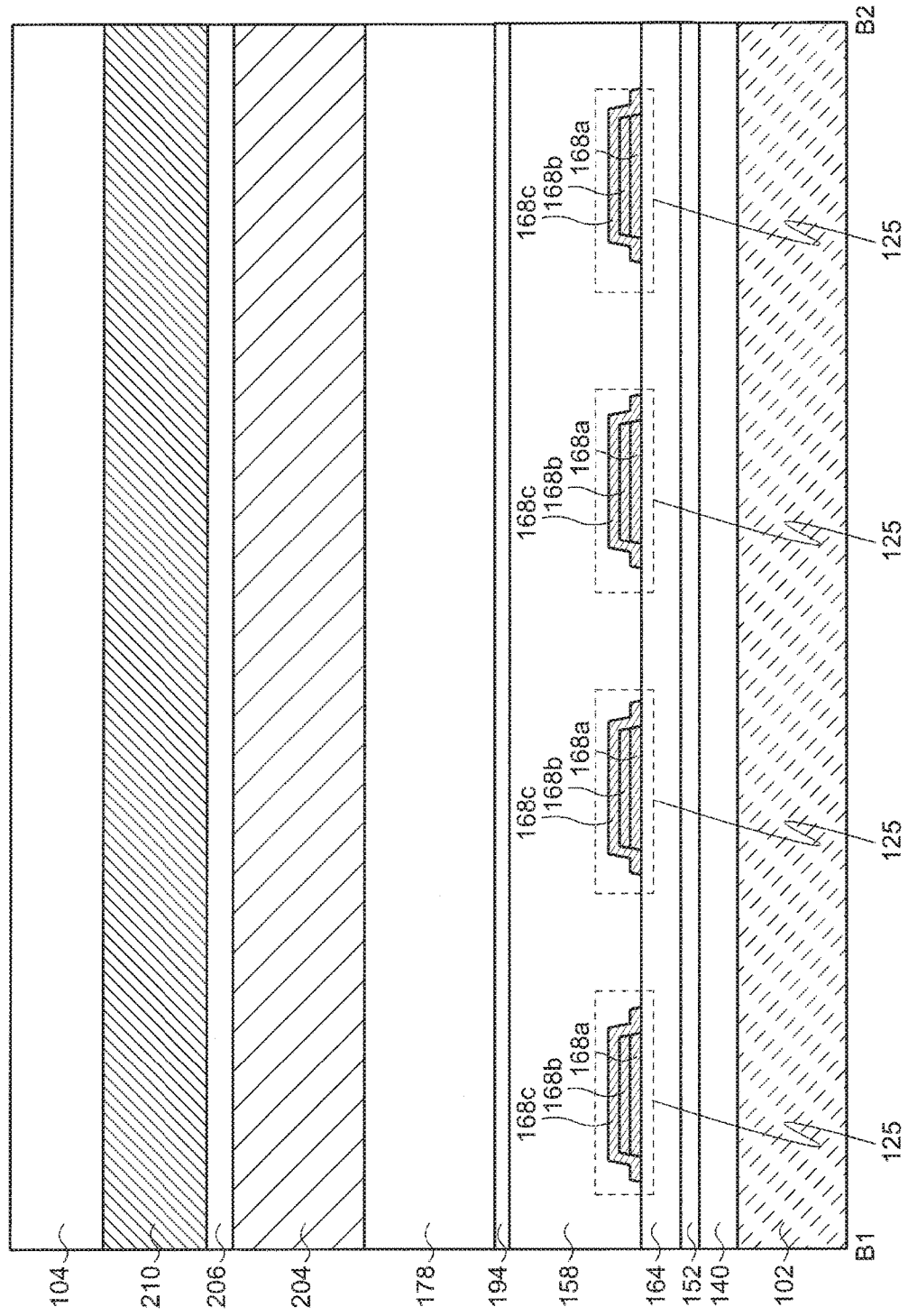
FIG. 8 is a cross-sectional schematic diagram of wiring in a display device related to one embodiment of the present invention.

FIG. 6 shows a planar schematic view of a plurality of terminal electrodes 116 of the display device 100, an image signal line drive circuit (driver IC) 120, and a region of one part of wiring connecting an image signal line drive circuit (driver IC) 120 with various wirings of a display region. FIG. 7 shows a cross-sectional schematic view between A1 and A2 of a plurality of terminal electrodes 116 shown in FIG. 6. In addition, FIG. 8 shows a cross-sectional schematic between B1 and B2 of the wiring shown in FIG. 6. Furthermore, the planar schematic view shown in FIG. 6 and the cross-sectional schematic views shown in FIG. 7 and FIG. 8 are examples and the present invention is not limited to these examples.

A wiring substrate (not shown in the diagram) for connecting the display device 100 with devices for outputting an image signal or a timing signal for controlling the operation of a circuit and the like, or a power supply is connected to the plurality of terminal electrodes 116 shown in FIG. 7. Contact points with the plurality of terminal electrodes 116 which are connected to the wiring substrate are exposed to the exterior.

The terminal electrode 116 has a multilayer wiring structure including a first conducting layer 168a, a second conducting layer 168b and a third conducting layer 168c. The first conducting layer 168a is in contact with the gate insulating film 164. The second conducting layer 168b is arranged above the first conducting layer 168a. The third conducting layer 168c is in contact with an upper surface and side surface of the second conducting layer 168b, a side surface of the first conducting layer 168a. The end part of the third conducting layer 168c arranged on the interlayer film 152. In addition, the terminal electrode 116 has a structure in which the connection electrode 176 is in contact with the third conducting layer and an end part thereof is arranged on the gate insulating film. Furthermore, in the terminal electrode 116, the second inorganic film 206 is in contact with the connection electrode 176 and the gate insulating film 164. Furthermore, a part of the connection electrode 176 does not include the second inorganic film 206 and is open.

The third conducting layer covers the side surface of the second conducting layer and thereby the terminal electrode 116 is not permeated by an etching gas, developing solution or stripping solution at the time of forming the planarizing film 158 after the formation of the wiring 168. In addition, the second conducting layer is not side-etched. Therefore, as is shown in FIG. 7, it is possible to stably form the taper processed shape of the terminal electrode 116.

In addition, since the taper shape of the terminal electrode 116 is stable, it is possible to realize good coverage of the connection electrode 176 and the terminal electrode 116 even if the thickness of the connection electrode 176 is thin.

Furthermore, since the third conducting film covers the side surface of the second conducting film, the connection electrode 176 is not in contact with the second conducting film. Therefore, for example, in the case when aluminum (Al) is used for the second conducting film and indium-tin oxide (ITO) is used for the connection electrode 176, it is possible to suppress corrosion of aluminum (Al).

In addition, since aluminum (Al) is not exposed, foreign matter is not generated at the opening of the terminal region 114 after the bonding process of the display device when using an etching gas. Therefore, contact of the terminal electrode 116 can be stably formed.

Furthermore, the terminal electrode 116 is input with an image signal and a timing signal for controlling the operation of a circuit. Since the contact of the terminal electrode 116 is good and wiring is also stably formed, it is possible to suppress the delay of a signal passing through the wiring and a voltage drop of a power supply voltage.

The lead wiring 125 shown in FIG. 8 has a multilayer wring structure including a first conducting layer 168a, a second conducting layer 168b and a third conducting layer 168c. The first conducting layer 168a is in contact with the gate insulating film 164. The second conducting layer 168b is arranged above the first conducting layer 168a. The third conducting layer 168c is in contact with an upper surface and side surfaces of the second conducting layer 168b, a side surface of the first conducting layer 168a. An end part arranged of the third conducting layer 168c is arranged on the interlayer film 152.

The lead wiring 125 shown in FIG. 8 plays a role of sending a signal output from the image signal line driver circuit (driver IC) 120 to various wirings in the display region. Therefore, it is possible to suppress the delay of a signal passing through the wiring and suppress a voltage drop of the power supply voltage.

Figure 9:
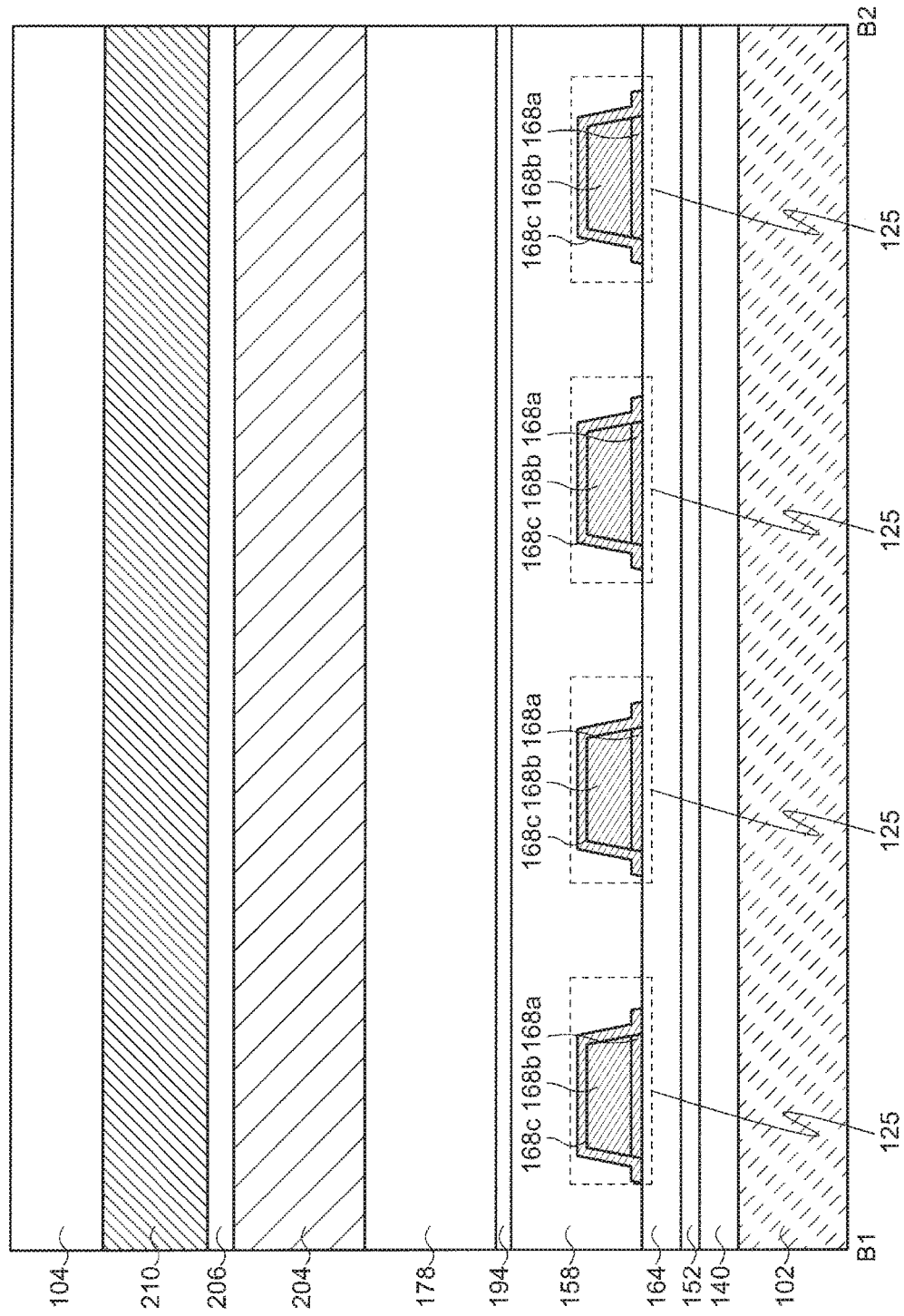
FIG. 9 is a cross-sectional schematic diagram of wiring in a display device related to one embodiment of the present invention.

FIG. 9 shows a cross-sectional diagram in the case where the thickness of the second conducting layer is formed thick. By forming the second conducting film thick, the resistance of the wiring can be reduced. Therefore, it is possible to further suppress delay of a signal passing through the wiring and further suppress a voltage drop of a power supply voltage applied to the wiring.

Figure 10:
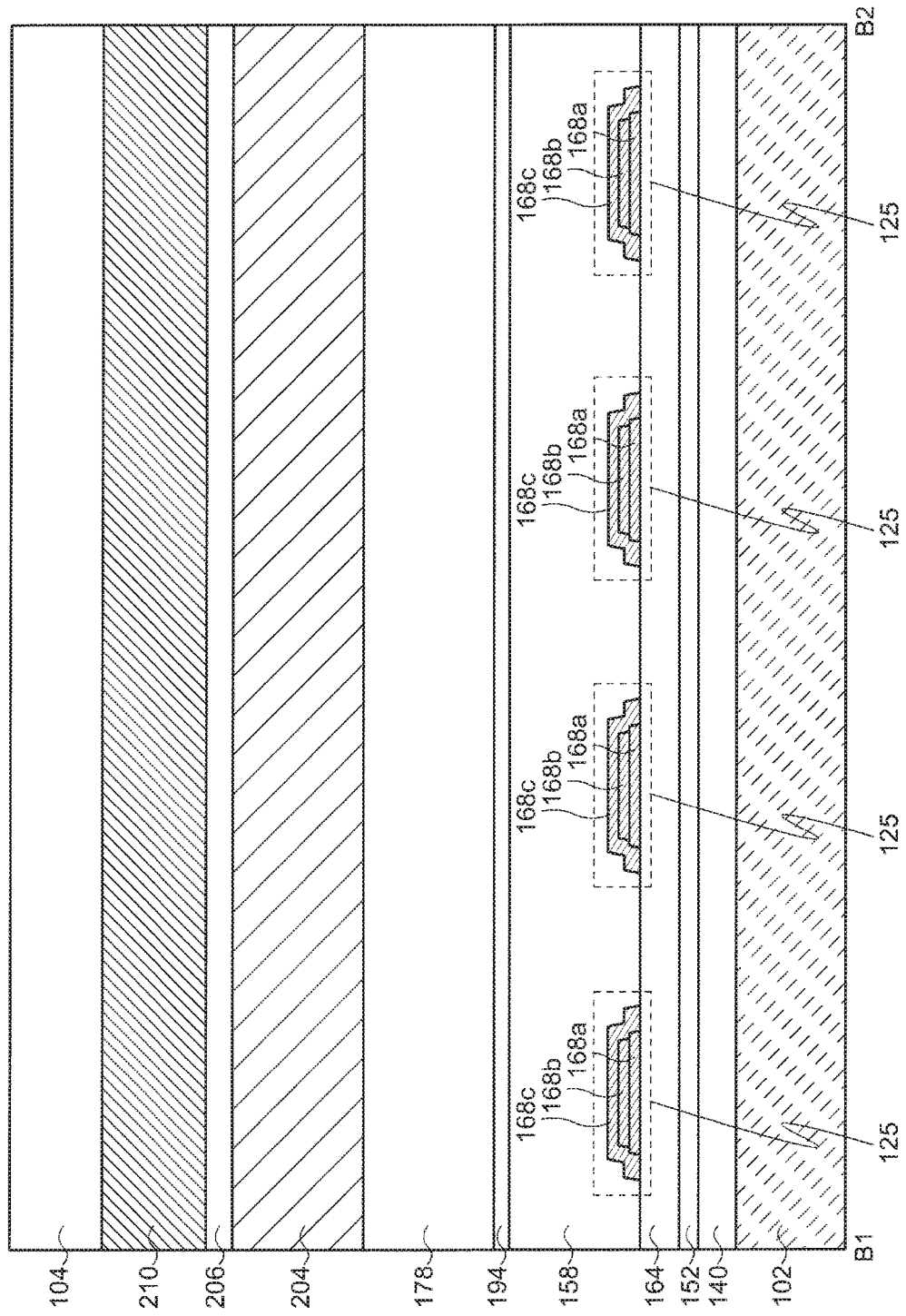
FIG. 10 is a cross-sectional schematic diagram of wiring in a display device related to one embodiment of the present invention.

FIG. 10 shows a cross-sectional diagram in the case when an end part of the second conducting layer is arranged further to the inside than an end part of the first conducting layer. By arranging the second conducting layer further inside than the first conducting layer, the third conducting layer can reliably cover the second conducting film. That is, it is possible to improve coverage of the third conducting layer and the second conducting film.

EMBODIMENT 2

In the present embodiment, a method of manufacturing the display device 100 according to one embodiment of the present invention is explained while referring to FIG. 11A to FIG. 17 using a display device as an example. Furthermore, the manufacturing method of the display device illustrated herein is merely an example and the present invention is not limited to this example.

1. Manufacturing Method
1-1. First Substrate, Transistor, Capacitor

Figure 11A:
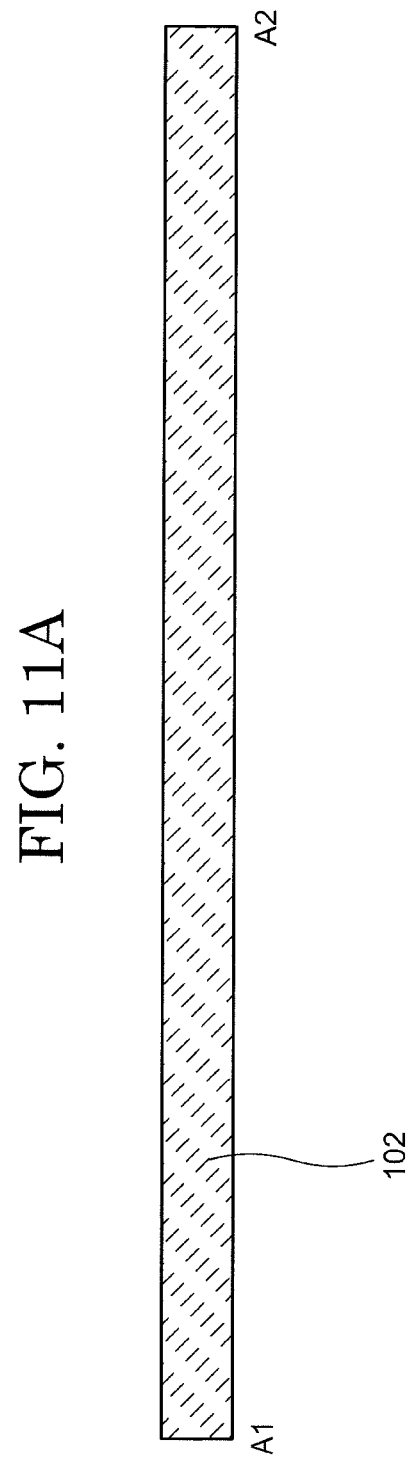
FIG. 11A is a cross-sectional schematic diagram for explaining a manufacturing method of a display device related to one embodiment of the present invention.
Figure 11B:
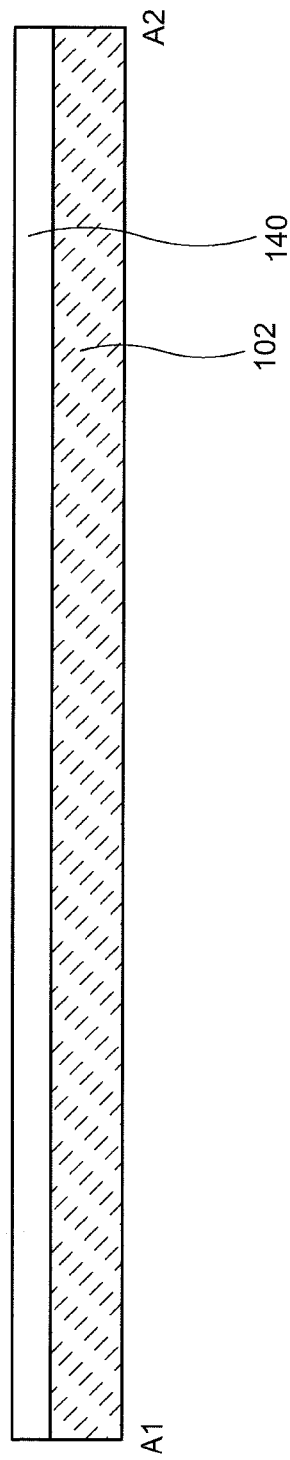
FIG. 11B is a cross-sectional schematic diagram for explaining a manufacturing method of a display device related to one embodiment of the present invention.

An underlying film 140 is formed above the first substrate 102 (FIG. 11A and FIG. 11B). The underlying film 140 includes a function for preventing the diffusion of impurities from the first substrate 102 and is formed for example, by a CVD method or the like using an inorganic compound such as silicon oxide, silicon nitride oxide, silicon oxynitride and silicon nitride or the like. In FIG. 11A, although the underlying film 140 is depicted having a single layer structure, the underlying film 140 may also have a structure in which a plurality of inorganic compound layers are stacked. For example, a three layer structure of silicon oxide, silicon nitride and silicon oxide, or a two layer structure of silicon nitride and silicon oxide or the like may be adopted.

Figure 11C:
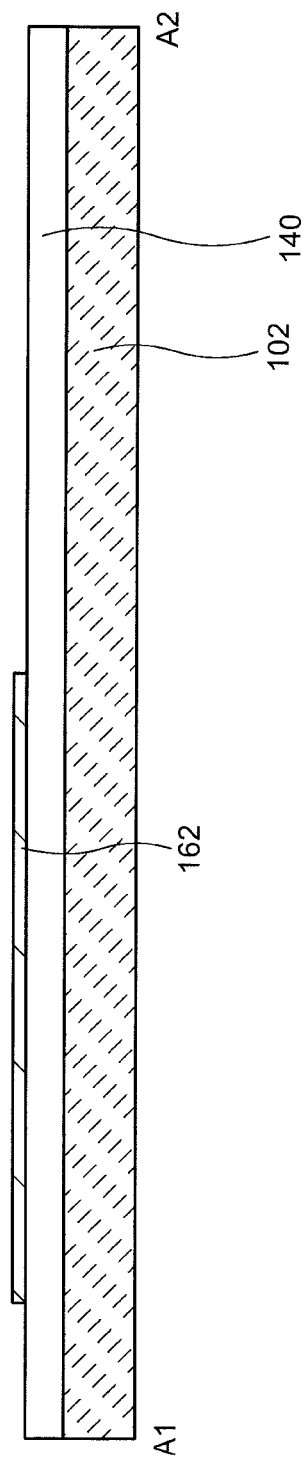
FIG. 11C is a cross-sectional schematic diagram for explaining a manufacturing method of a display device related to one embodiment of the present invention.

Next, as is shown in FIG. 11C, a semiconductor film 162 is formed above the underlying film 140. The semiconductor film 162 can include silicon or an oxide semiconductor and can be formed by CVD or a sputtering method. For example, a mixed oxide (IGO) of indium and gallium, a mixed oxide of indium, gallium, zinc (IGZO) or the like can be used as the oxide semiconductor. The crystallinity of the semiconductor film 162 can also be arbitrarily selected and may be any one of amorphous, microcrystalline, polycrystalline and a single crystal. In addition, these morphologies may also be mixed.

Figure 12A:
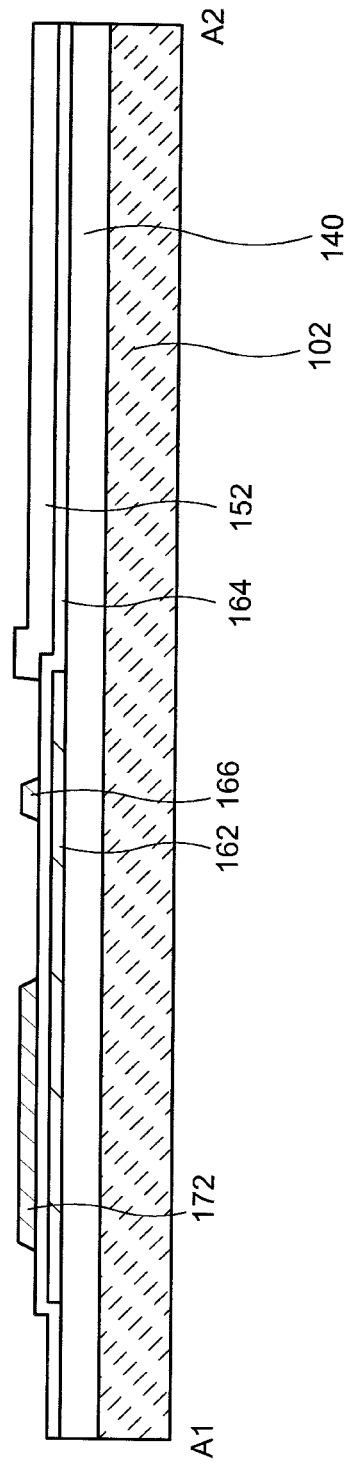
FIG. 12A is a cross-sectional schematic diagram for explaining a manufacturing method of a display device related to one embodiment of the present invention.

Next, a gate insulating film 164 is formed above the semiconductor film 162 in a single layer or stacked layer structure (FIG. 12A). The gate insulating film 164 can be formed by appropriately combining the materials used for the underlying film 140. The formation method can also be selected from a method applicable for forming the underlying film 140.

Next, as is shown in FIG. 12A, a gate electrode 166 and an electrode 172 of a storage capacitor are formed above the gate insulating film 164 so as to overlap the semiconductor film 162. Since the gate electrode 166 and the storage capacitor electrode 172 can be formed at the same time, they can be present within the same layer. The gate electrode 166 and the electrode 172 of the storage capacitor are formed by an alloy or a single layer of a metal, such as aluminum (Al), copper (Cu), titanium (Ti), molybdenum (Mo), tantalum (Ta) tungsten (W), or it can be formed in a stacked layer structure. For example, they may be formed by stacking a highly conductive metal such as (Al) or copper (Cu) and a metal with high blocking properties such as titanium (Ti) or molybdenum (Mo). Specifically, they can have a multilayer structure in which aluminum (Al) is sandwiched between upper and lower layers of titanium (Ti), a structure in which aluminum (Al) is sandwiched between upper and lower layers of molybdenum (Mo), or a structure in which aluminum (Al) is sandwiched between upper and lower layers of tungsten (W). For example, an MOCVD method, a sputtering method, or the like can be exemplified as a method of forming the gate electrode 166 and the electrode 172 of a storage capacitor.

The semiconductor film 162 may be doped according to necessity. In this way, a pair of source regions or drain regions containing impurities can be formed with the channel region interposed therebetween together with the channel region.

Figure 12B:
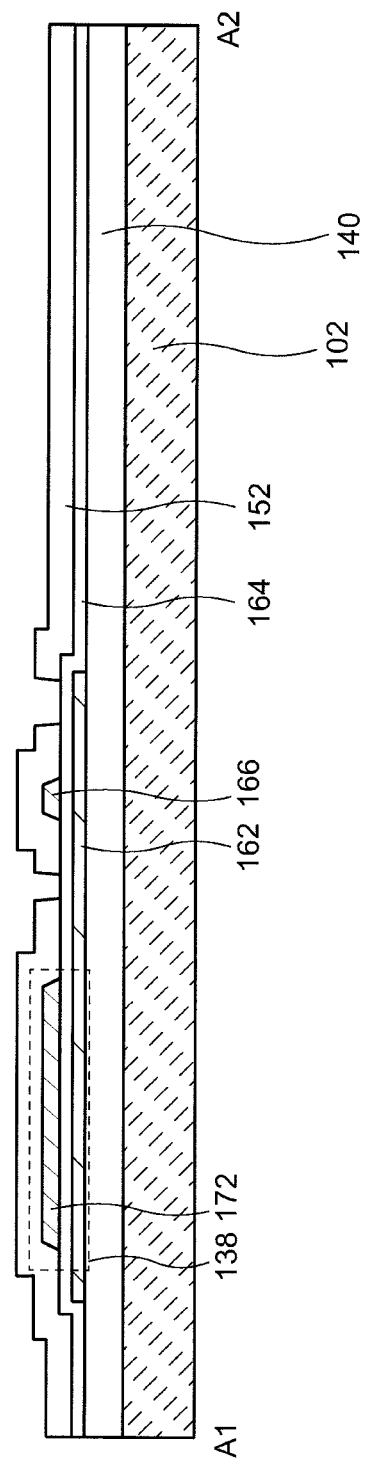
FIG. 12B is a cross-sectional schematic diagram for explaining a manufacturing method of a display device related to one embodiment of the present invention.

Next, an interlayer film 152 is formed over the gate electrode 166 and the electrode 172 of the storage capacitor 138 (FIG. 12B). The interlayer film 152 can be formed by a single layer or a stacked layer structure by appropriately combining materials used for the underlying film 150 and the gate insulating film 164. For example, a stacked structure of silicon nitride and silicon oxide can be adopted.

After this, etching is performed on the interlayer film 152 and the gate insulating film 164 forming openings which reach the source/drain regions (FIG. 12B). The etching can be performed by applying dry etching using an alkane or alkene containing fluorine for example.

Figure 13A:
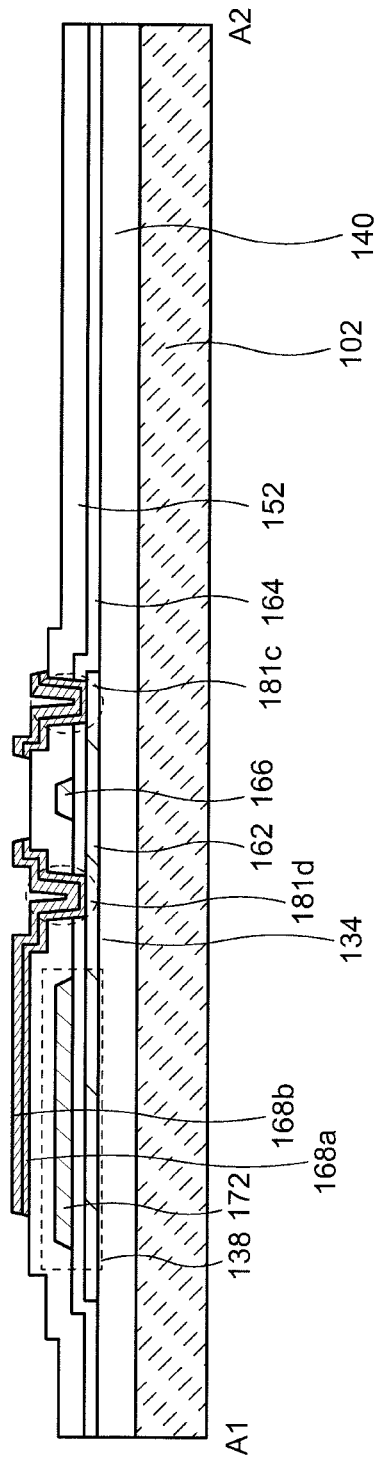
FIG. 13A is a cross-sectional schematic diagram for explaining a manufacturing method of a display device related to one embodiment of the present invention.

After this, a metal film is formed to cover the opening, and the metal film is processed by etching thereby forming the source or drain electrode 168_1 and the source or drain electrode 168_2 (FIG. 13A and FIG. 13B).

A formation method of the source/drain electrodes 168_1 and 168_2 is explained in more detail (FIG. 13A and FIG. 13B).

First, a first conducting layer 168a is formed as a metal film of the source or drain electrode 168_1 and the source or drain electrode 168_2. Next, a second conducting layer 168b is formed. Then, the first conducting layer 168a and the second conducting layer 168b are etched together. The etching at this time is preferred to be dry etching. A chlorine-based gas such as Cl 2 or BCl3 is used as an etching gas. N2 gas may be added to the chlorine-based gas.

Next, a third conducting layer 168c is formed as a metal film of the source or drain electrode 168_1 and the source or drain electrode 168_2. Then, the third conducting layer 168c is etched to form a source or drain electrode 168_1 and a source or drain electrode 168_2 (FIG. 13A and FIG. 13B).

As described above, the source or drain electrode 168_1 and the source or drain electrode 168_2 are formed by two steps of processing of the first conducting layer 168a and the second conducting layer 168b, and processing of the third conducting layer 168c. The third conducting layer 168c is arranged in contact with the side surface of the second conducting layer 168b and the side surface of the first conducting layer 168a, and an end part is arranged above the interlayer film 152. The side surface of the second conducting layer 168b is not permeated by an etching gas, developing solution and the stripping solution at the time of forming the planarization film 158 which is subsequently formed. In addition, the second conducting layer is not side-etched. Therefore, the taper shape can be stably formed. In addition, the coverage of the planarization film 158 is also good. Therefore, it is possible to provide a display device in which display defects and a drop in the display yield are suppressed and having a wiring structure that suppresses contact defects and wiring corrosion.

In addition, the source or drain electrode 168_1 is electrically connected to the image signal line 128. Therefore, it is possible to suppress a delay of signals passing through the wiring and a voltage drop of the power supply voltage. Therefore, it is possible to provide a display device in which display defects and a drop in display yield are suppressed and having a wiring structure that suppresses contact defects and wiring corrosion.

The first conducting layer can be formed from a metal such as Mn (manganese), titanium (Ti), molybdenum (Mo), tantalum (Ta), tungsten (W) or an alloy thereof.

The second conducting layer can be formed from a metal such as aluminum (Al), silicon (Si), copper (Cu), neodymium (Nd), or an alloy thereof.

The third conducting layer 168c can be formed of a metal such as Mn (manganese), titanium (Ti), molybdenum (Mo), tantalum (Ta), tungsten (W) or an alloy thereof.

The first conducting layer, the second conducting layer and the third conducting layer 168c are formed for example by stacking a metal having high conductivity such as aluminum (Al) or copper (Cu), and a metal having high blocking properties such as titanium (Ti), molybdenum (Mo), or the like. Specifically, a structure can be adopted in which aluminum (Al) is sandwiched between titanium (Ti), a structure in which aluminum (Al) between molybdenum (Mo), and a stacked structure in which aluminum (Al) is sandwiched between tungsten (W). Furthermore, titanium nitride (TiN) may be formed above the third conducting layer. For example, in the case where titanium (Ti) is used for the third conducting layer, titanium nitride (TiN) is formed above titanium (Ti), thereby it is possible to prevent oxidation of titanium (Ti) in a treatment using hydrofluoric acid for surface treatment.

Examples of a formation method of the first conducting layer, the second conducting layer and the third conducting layer 168c include MOCVD, sputtering, and the like.

A part of the source or drain electrode 168_2 is formed so as to overlap with the electrode 172 of a storage capacitor. Through the steps described above, the transistor 160 and the capacitor 138 are formed. Although not shown in the diagram, the terminal electrode 116 and the like is also formed at the same time by formation and etching of a metal film.

Figure 14A:
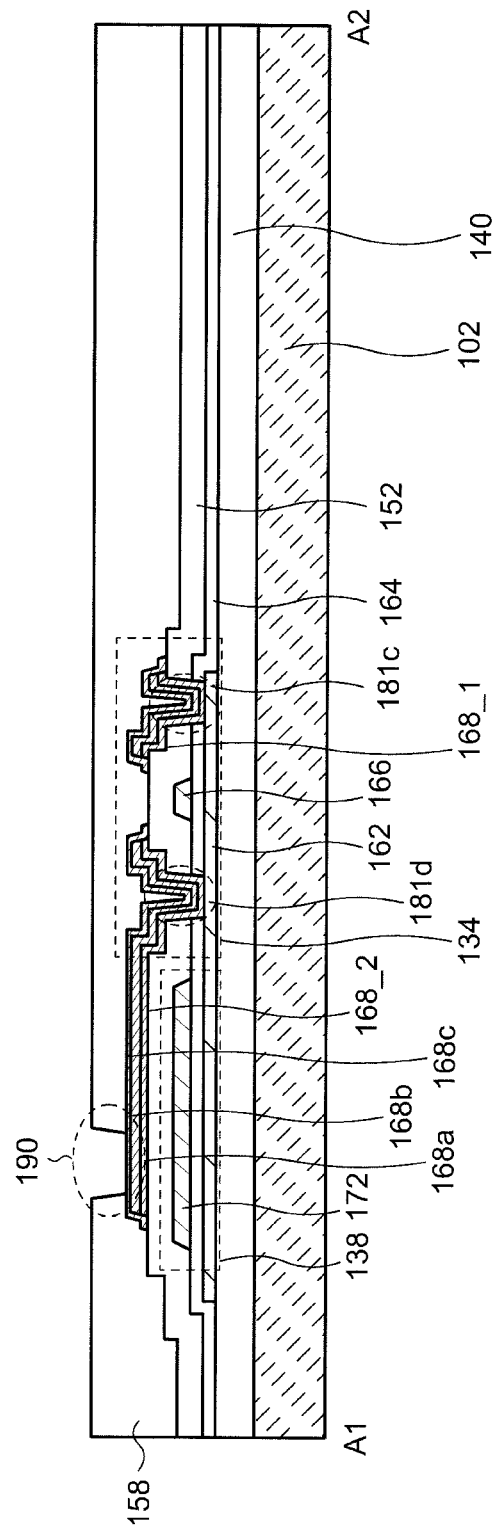
FIG. 14A is a cross-sectional schematic diagram for explaining a manufacturing method of a display device related to one embodiment of the present invention.

Although irregularities caused by the drive transistor 134 and the capacitor 138 are formed on the first substrate 102 by the steps hereto, by forming the planarization film 158, these irregularities are absorbed to give a flat surface (FIG. 14A). The planarization film 158 can be formed by a spin coating method, a dip coating method, a printing method, or the like using a polymer material such as acrylic resin, epoxy resin, polyimide, polysiloxane or the like. Although not shown in the diagram, a protective film (for example, a protective film formed of an inorganic insulating film) may be further formed above the planarization film 158.

1-2. Light Emitting Element, Additional Capacitor

Figure 14B:
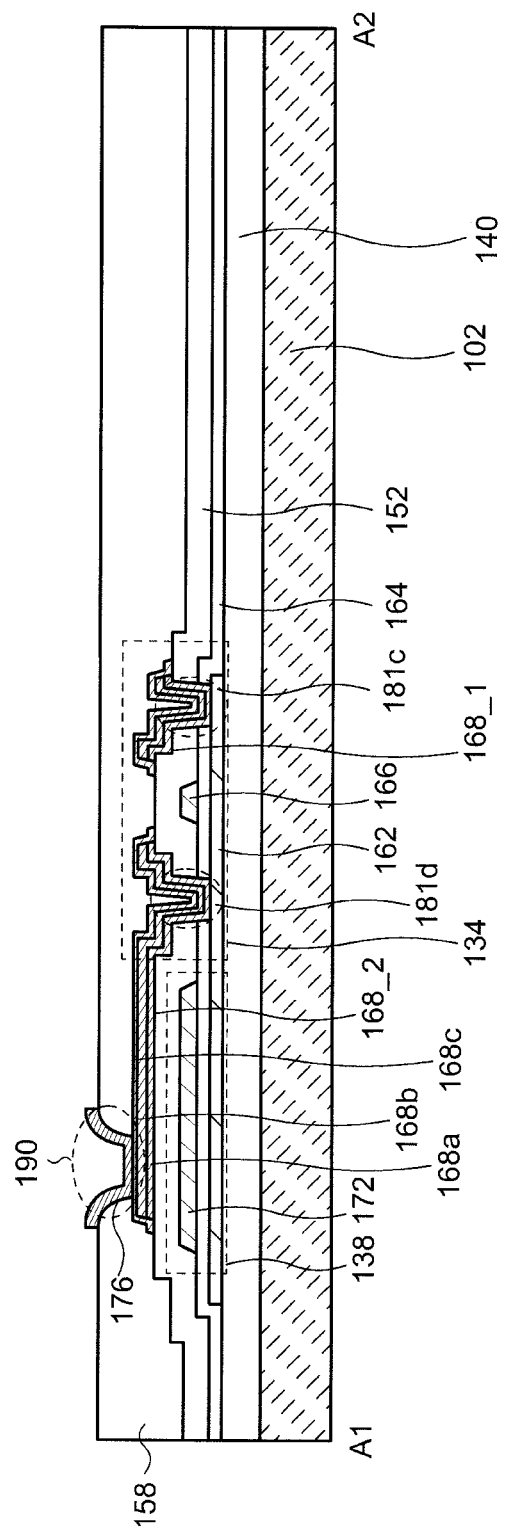
FIG. 14B is a cross-sectional schematic diagram for explaining a manufacturing method of a display device related to one embodiment of the present invention.

Next, the planarization film 158 is etched to expose a part of the source or drain electrode 168 (FIG. 14A). Then, a connection electrode 176 is formed so as to cover this opening (FIG. 14B). The connection electrode 176 can include a conductive oxide have translucency such as indium-tin oxide (ITO) or indium-zinc oxide (IZO), and can be formed by applying a sputtering method, a sol-gel method or the like. Furthermore, although formation of the connection electrode 176 is optional, it is possible to prevent or reduce damage to the source or drain electrode 168 in a subsequent process, and as a result, it is possible to effectively suppress the occurrence of contact resistance in the electrical connection between the source or drain electrode 168 and light emitting element 180.

Figure 15A:
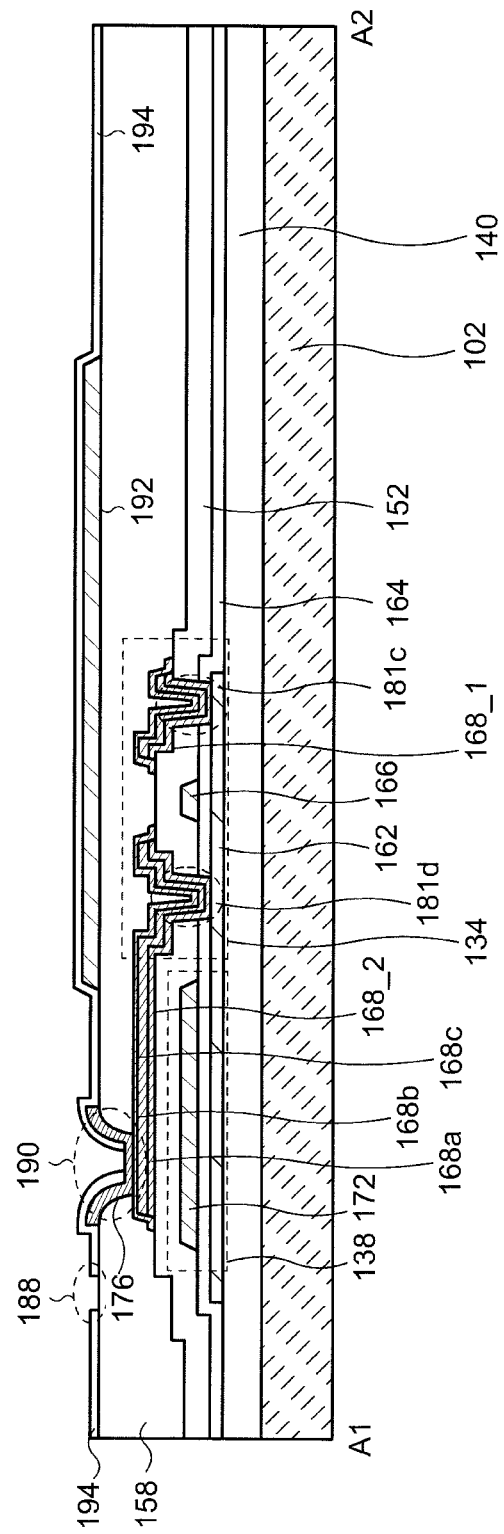
FIG. 15A is a cross-sectional schematic diagram for explaining a manufacturing method of a display device related to one embodiment of the present invention.

Next, the additional capacitor electrode 192 is formed above the planarization film 158 (FIG. 15A). The additional capacitor electrode 192 can also have the same structure as the gate electrode 166 and the source or drain electrode 168. After this, a capacitor insulating film 194 is formed (FIG. 15A). The capacitor insulating film 194 protects the planarization film 158 and functions as a dielectric film of the additional capacitor 190. The capacitor insulating film 194 is arranged with an opening for exposing a part (bottom surface) of the connection electrode 176. At this time, the opening 188 exposing the planarization film 158 may be formed.

Figure 15B:
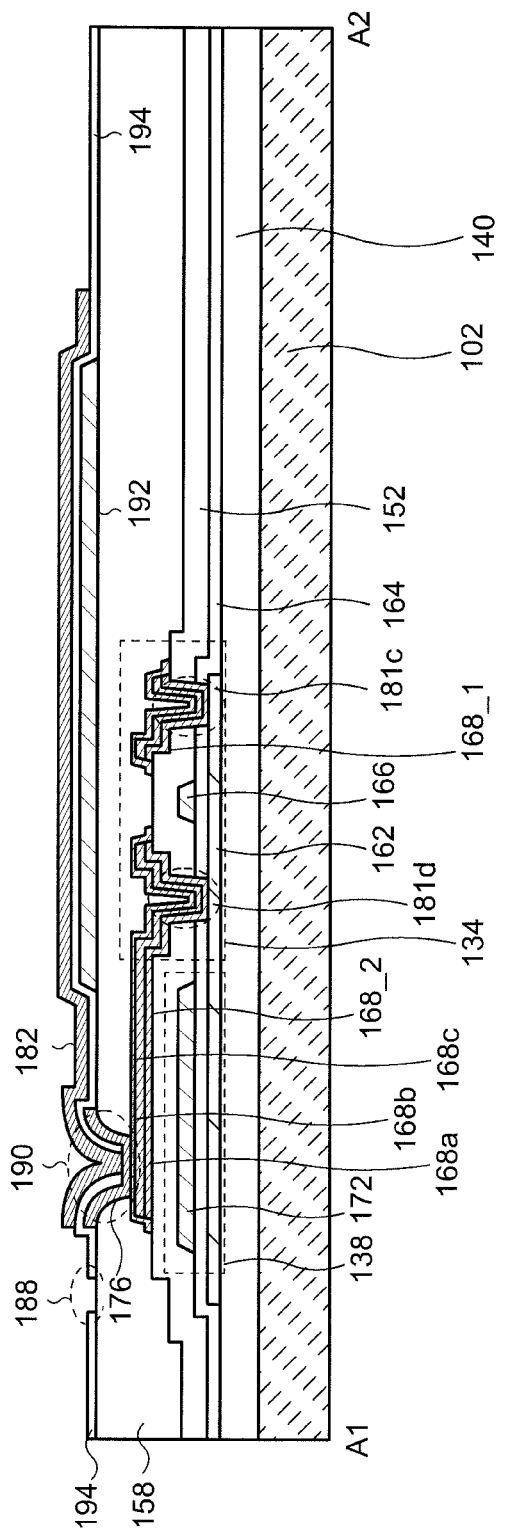
FIG. 15B is a cross-sectional schematic diagram for explaining a manufacturing method of a display device related to one embodiment of the present invention.

Next, a first electrode 182 of the light emitting element 180 is formed above the capacitor insulating film 194 so as to cover the connection electrode 176 and to overlap with the additional capacitor electrode 192 (FIG. 15B). A metal that reflects visible light or a conductive oxide that transmits visible light or the like can be used for the first electrode 182. In the case when light emission from the light emitting element 180 is extracted from the substrate 110 side, a transparent conductive oxide such as ITO or IZO is used, and the first electrode 182 may be formed by applying a sputtering method, a sol-gel method or the like. Conversely, in the case when the light emitted from the light emitting element is extracted from the side opposite to the substrate 110, a metal with high reflectance such as aluminum or silver may be used for the first electrode 182. At this time, a conductive oxide may be stacked above and/or below these metals. For example, a stacked structure such as a structure in which upper and lower sides of silver are sandwiched by ITO and a structure in which upper and lower sides of aluminum are sandwiched by IZO can be adopted. Through the processes up to this point, the additional capacitor 190 formed by the additional capacitor electrode 192, the capacitor insulating film 194 and the first electrode 182 is formed (FIG. 16).

Figure 16:
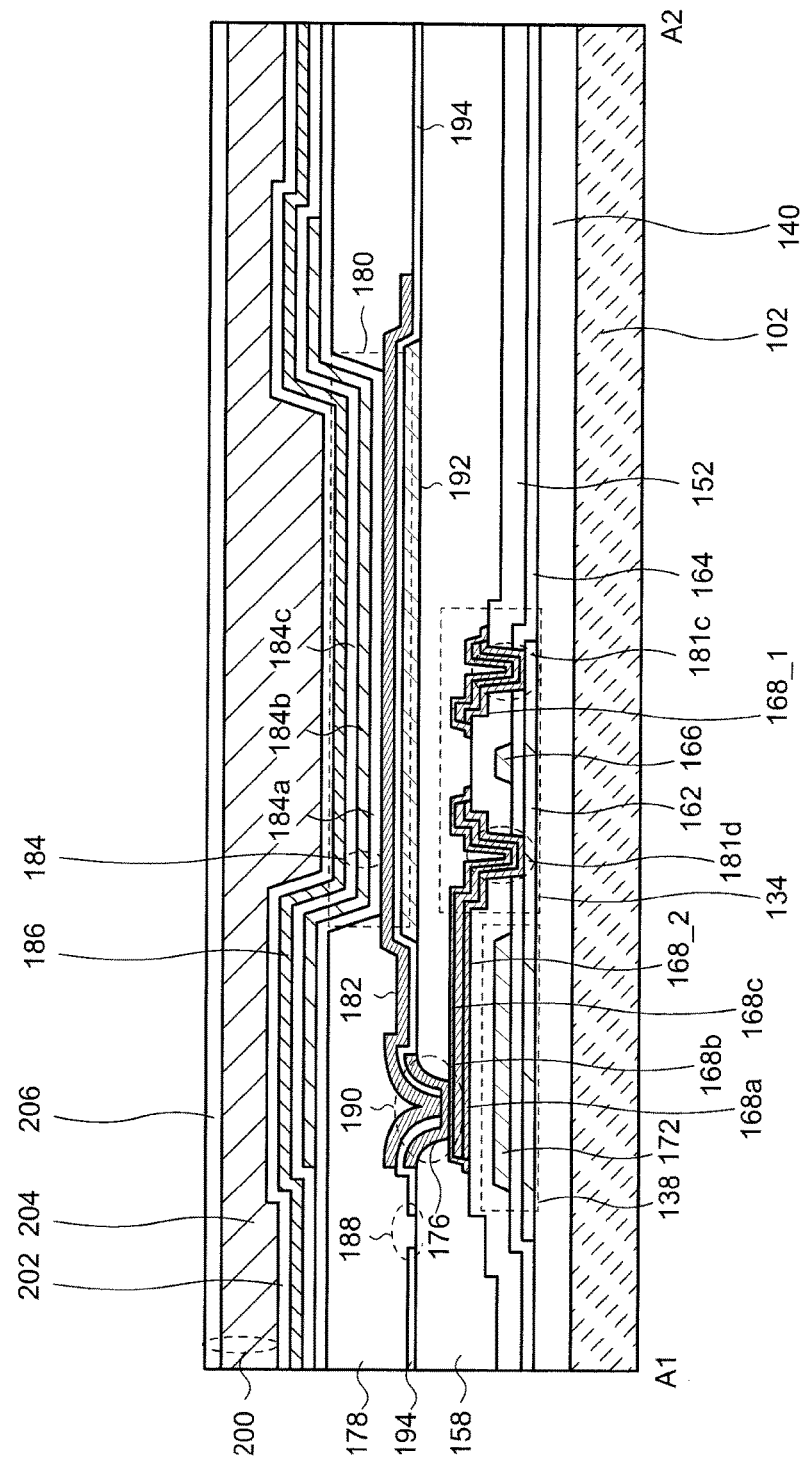
FIG. 16 is a cross-sectional schematic diagram for explaining a manufacturing method of a display device related to one embodiment of the present invention.

Next, an insulating film is formed so as to cover an end part of the first electrode 182, and a partition wall 178 is formed (FIG. 16). The partition wall 178 covers an end part of the first electrode 182, thereby preventing a short circuit between the first electrode 182 and the second electrode 186, and has a function of electrically separating adjacent pixels 108 from each other. For example, a polymer material such as acrylic resin, epoxy resin, polyimide, polyamide, polysiloxane or the like can be used for the partition wall 178.

After formation of the partition wall 178, the EL layer 184 and the second electrode 186 are formed (FIG. 16). As described above, the EL layer 184 is a layer responsible for recombination of charges injected from the first electrode 182 and the second electrode 186, and is formed by combining various functional layers. The EL layer 184 can be formed by using a vapor deposition method, an inkjet method or a spin coating method and the like.

A material similar to the material of the first electrode 182 can be used for the second electrode 186. When the light emitted from the EL layer 184 is extracted from the side of the first electrode 182, a material having a high reflectance to visible light is preferred for the second electrode 186, and for example, silver or aluminum or the like can be used. The second electrode 186 can be formed by applying a vapor deposition method or a sputtering method or the like to these materials. On the other hand, when extracting light from the side of the second electrode 186, a conductive oxide such as ITO or IZO can be used. Alternatively, magnesium, silver or an alloy thereof can be used and can be formed to a thickness (several nm to several tens of nm) that allows visible light to pass through. A second electrode 186 may be formed by stacking a conductive oxide above these metals or alloys. Through the above process, the light emitting element 180 and the additional capacitor 190 are formed.

1-3. Passivation Film, Second Substrate

Next, a passivation film 200 is formed above the second electrode 186 (FIG. 16). The passivation film 200 has a function of preventing impurities such as water and oxygen from entering a light emitting element from the exterior. The three layer structure shown in FIG. 17 can be given as an example of the passivation film 200. In this case, the passivation film 200 can have a structure in which an organic film 204 including an organic compound is sandwiched between two inorganic films (first inorganic film 202 and second inorganic film 206) including an inorganic compound.

The first inorganic film 202 is formed above the second electrode 186 (FIG. 16). The first inorganic film 202 can include an inorganic material such as silicon nitride, silicon oxide, silicon nitride oxide, silicon oxynitride or the like, and can be formed by the same method as the underlying film 150.

Figure 17:
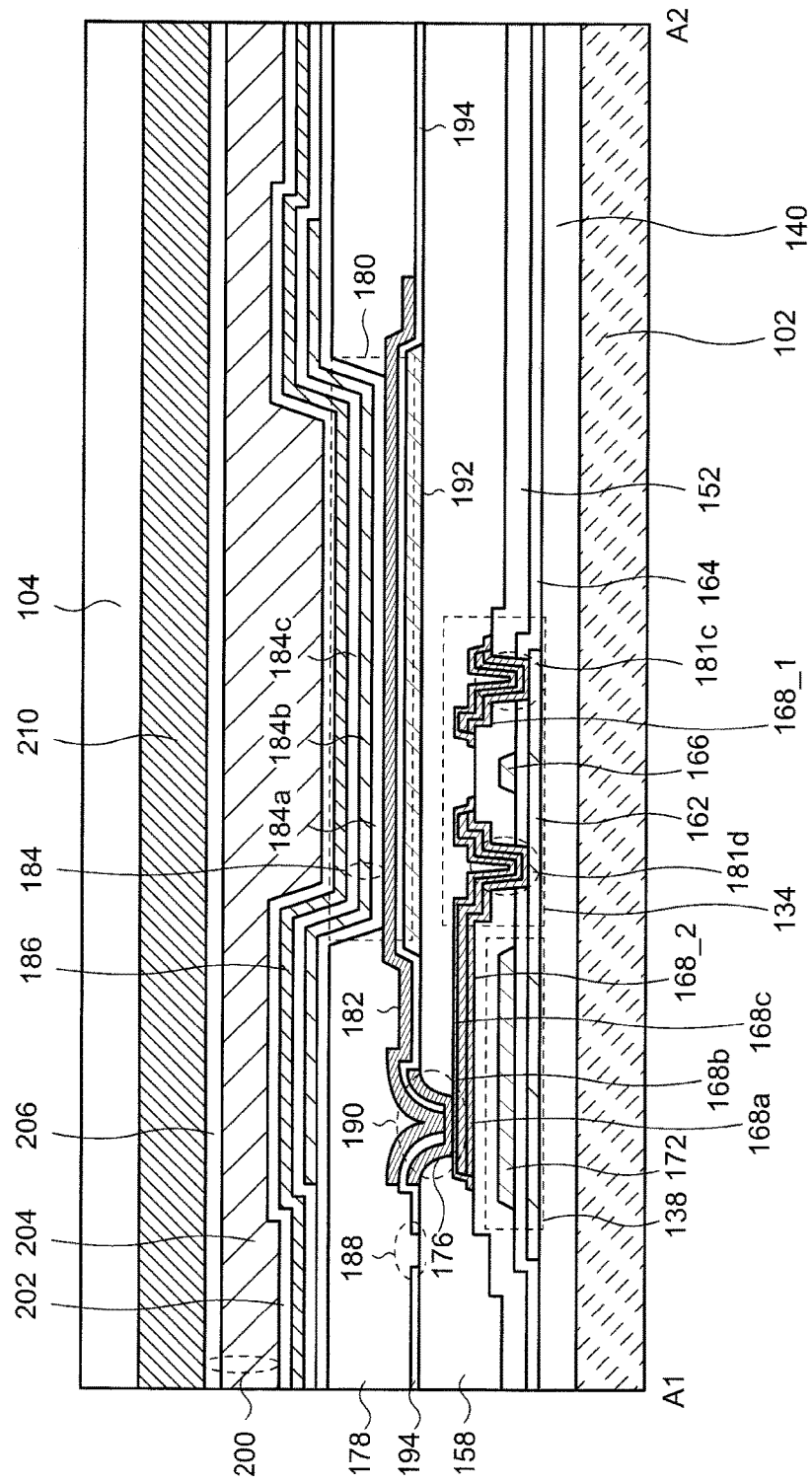
FIG. 17 is a cross-sectional schematic diagram for explaining a manufacturing method of a display device related to one embodiment of the present invention.

Next, the organic film 204 is formed (FIG. 16). The organic film 204 may include an organic resin including acrylic resin, epoxy resin, polysiloxane, polyimide, polyester or the like. In addition, as is shown in FIG. 17, the organic film 204 may be formed so as to absorb irregularities caused by the partition wall 178 and also to a thickness to provide a flat surface. Although the organic film 204 can be formed by a wet film formation method such as an inkjet method or a printing method, it is also possible to make an oligomer, which is a raw material of the organic resin described above, into a mist or gaseous state under a reduced pressure, and subsequently polymerize the oligomer.

After that, a second inorganic film 206 is formed (FIG. 16). The second inorganic film 206 has a structure similar to that of the first inorganic film 202 and can be formed by the same method. The passivation film 200 is formed through the steps described above. By forming the passivation film 200, it is possible to prevent impurities from entering into the display device 100, and it is possible to improve the reliability of the display device 100.

Next, the second substrate 104 is arranged above the passivation film 200 via a filler 210 (FIG. 17). The filler 210 has a function of bonding the passivation film 200 and the second substrate 104, and an epoxy resin, an acrylic resin or the like can be used. A dry material may be mixed into the filler 210. The same substrate as the first substrate 102 can be used as the second substrate 104. In this case, the second substrate 104 may be called an opposing substrate. Although not shown in the diagram, as an arbitrary structure, a touch sensor may be provided between the passivation film 200 and the filler 210 or above the second substrate 104. An example of a typical touch sensor is a projection type capacitance type touch panel. A color filter, a light blocking film and a polarizing plate may also be formed between the passivation film 200 and the filler 210.

Each of the embodiments described above as embodiments of the present invention can be implemented in combination as appropriate as long as they do not contradict each other. In addition, those based on the display device of each embodiment, or those in which a person skilled in the art could appropriately add, delete or change design elements, or those in which addition, omission, or a change in conditions is performed are also included within the scope of the present invention as long as they do not depart from the concept of the present invention.

Although a display device is mainly exemplified as an example in the present specification, as another application example, any flat panel type display device such as other self-light emitting type display devices, liquid crystal display devices, electronic paper type display devices having an electrophoretic element or the like can be exemplified. In addition, the present invention can be applied to medium to small size to large size devices without any particular limitations.

Even if the other effects are different from the effects brought about by the aspects of each embodiment described above, what are obvious from the descriptions of the present specification or what are easily predictable by a person skilled in the art, such effects are to be interpreted as being provided by the present invention.

What is claimed is:

1. A display device comprising:
a plurality of pixels arranged in a first direction and a second direction intersecting the first direction;
a first wiring extending along a pixel arranged in the first direction among the plurality of pixels;
a second wiring extending along a pixel arranged in the second direction intersecting the first direction among the plurality of pixels; and
a light transmitting conductive layer,
wherein
at least one of the first wiring and the second wiring includes a first conducting layer arranged contacting an insulating surface, a second conducting layer arranged above the first conducting layer, and a third conducting layer arranged contacting an upper surface and side surface of the second conducting layer and contacting a side surface of the first conducting layer, an end part of the third conducting layer being arranged on the insulating surface, and
the light transmitting conductive layer contacts the third conducting layer and the second conducting layer via a second opening part.

2. The display device according to claim 1, wherein the first conducting layer and the second conducting layer have a tapered cross-sectional shape in a direction intersecting a longitudinal direction.

3. The display device according to claim 1, wherein an end part of the second conducting layer is arranged further to the interior than an end part of the first conducting layer.

4. The display device according to claim 1, wherein the first wiring is a scanning signal line and the second wiring is an image signal line.

5. The display device according to claim 1, wherein a first insulating layer is included between the first wiring and the second wiring.

6. The display device according to claim 1, further comprising:
a terminal electrode.

7. The display device according to claim 6, wherein the terminal electrode has a structure stacked with the first conducting layer, the second conducting layer and the third conducting layer.

8. The display device according to claim 6, wherein the terminal electrode is arranged on the outer side of the plurality of pixels.

9. The display device according to claim 6, wherein the terminal electrode includes a first opening part.

10. The display device according to claim 9, wherein the first opening part is arranged further to an inner side than the terminal electrode.

11. The display device according to claim 1, wherein at least one of the first wiring and the second wiring includes the second opening part in a region of at least one part.

12. The display device according to claim 11, wherein the second opening part is arranged further to the inner side than the first wiring and the second wiring.

13. The display device according to claim 1 wherein a second insulating layer is included between at least one of the first wiring and the second wiring and the light transmitting conductive layer.

14. The display device according to claim 1, wherein the first conducting layer uses a material having a higher resistance than the second conducting layer.

15. The display device according to claim 1, wherein the third conducting layer uses a material having a higher resistance than the second conducting layer.

16. The display device according to claim 1, wherein the third conducting layer includes one or a plurality of types of metal elements selected from manganese (Mn), titanium (Ti), molybdenum (Mo), tantalum (Ta) and tungsten (W).

17. The display device according to claim 1, wherein the second conducting layer is aluminum or a metal including aluminum.

18. The display device according to claim 1, wherein the light transmitting conductive layer is one type selected from ITO (indium doped with tin oxide), IZO (indium oxide zinc oxide) or ZnO (zinc oxide).

* * * * *